United States Patent
Nam et al.

(10) Patent No.: US 10,727,255 B2
(45) Date of Patent: Jul. 28, 2020

(54) DISPLAY DEVICE AND METHOD OF MANUFACTURING THE SAME

(71) Applicant: LG Display Co., Ltd., Seoul (KR)

(72) Inventors: Yousung Nam, Gwangmyeong-si (KR); Changseung Woo, Goyang-si (KR); Soonhwan Hong, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/189,688

(22) Filed: Nov. 13, 2018

(65) Prior Publication Data
US 2019/0079336 A1     Mar. 14, 2019

Related U.S. Application Data

(62) Division of application No. 14/808,825, filed on Jul. 24, 2015, now Pat. No. 10,156,747.

(30) Foreign Application Priority Data

Jul. 25, 2014    (KR) ................. 10-2014-0094867

(51) Int. Cl.
| | | |
|---|---|---|
| *H01L 27/12* | (2006.01) | |
| *G02F 1/1333* | (2006.01) | |
| *G02F 1/1337* | (2006.01) | |
| *G02F 1/1343* | (2006.01) | |
| *G02F 1/1368* | (2006.01) | |
| *H01L 29/66* | (2006.01) | |
| *H01L 29/786* | (2006.01) | |

(52) U.S. Cl.
CPC ........ *H01L 27/1248* (2013.01); *G02F 1/1337* (2013.01); *G02F 1/1368* (2013.01);
(Continued)

(58) Field of Classification Search
CPC ... G02F 1/136213; G02F 2001/134354; G02F 1/136286; G02F 1/134363; G02F 1/1368;
(Continued)

(56) References Cited

U.S. PATENT DOCUMENTS

| 7,102,707 B2 | 9/2006 | Fujimaki |
|---|---|---|
| 7,105,368 B2 | 9/2006 | Fujimaki et al. |

(Continued)

FOREIGN PATENT DOCUMENTS

| CN | 1661451 A | 8/2005 |
|---|---|---|
| CN | 102033360 A | 4/2011 |

(Continued)

OTHER PUBLICATIONS

First Office Action, Chinese Patent Application No. 201580019025.9, dated Dec. 5, 2018, 19 pages.

(Continued)

*Primary Examiner* — Shan Liu
(74) *Attorney, Agent, or Firm* — Fenwick & West LLP

(57) ABSTRACT

A display device optimized to operate in a low frame rate mode under certain predetermined conditions is provided. To reduce pixel discharge during the low frame rate mode, the display device employees the TFTs with metal oxide semiconductor layer, the optical alignment layer with an upper portion and a lower portion having different resistivity. In addition, a passivation layer is provided between the optical alignment layer and the pixel or the common electrode for compensating the low resistivity of the lower portion of the optical alignment layer. As such, various visual defects associated with the pixel discharge can be reduced even when the display device is operating under the low frame rate mode.

14 Claims, 16 Drawing Sheets

(52) U.S. Cl.
CPC .... *G02F 1/13338* (2013.01); *G02F 1/133345* (2013.01); *G02F 1/133723* (2013.01); *G02F 1/133788* (2013.01); *G02F 1/134363* (2013.01); *H01L 27/124* (2013.01); *H01L 27/1225* (2013.01); *H01L 27/1259* (2013.01); *H01L 29/66969* (2013.01); *H01L 29/7869* (2013.01); *G02F 2001/134372* (2013.01)

(58) Field of Classification Search
CPC ......... G02F 1/133345; G02F 1/133788; G02F 2001/134372; G02F 1/133707; G02F 1/13378; G02F 1/133784; G02F 1/133753; G02F 1/3775; G02F 1/133719; G02F 1/0027; G02F 1/141; G02F 2001/13787; G02F 2001/133746; G02F 2001/133749; G02F 2001/133773; G02F 2001/3548; G02F 2001/133742; G02F 2001/133761; G02F 1/13; G02F 1/0018; G02F 1/133365; G02F 2001/13775; G02F 2202/021; G02F 2202/023; G02F 2202/025; G02F 2202/20; G02F 2202/30; G02F 2202/34; G02F 2202/36; G02F 1/133711; G02F 1/133703; G02F 2001/133715; G02F 2001/133726; G02F 2001/133796; G02F 2001/133769; G02F 2202/00; G02F 2202/42; G02F 1/133734; G02F 1/133723; G02F 1/1337; G02F 2001/133738; G02F 2001/133776; G02F 2200/00; G02F 2200/02; H01L 27/1255; H01L 27/3265; H01L 27/1225; H01L 29/66969; H01L 27/1259; H01L 27/1248; H01L 27/124; H01L 29/7869; H01L 21/02211; G09G 2300/0495; G09G 2300/0486; G09G 2300/0876; H05K 3/389; C08F 259/08; C09K 2019/548; C09K 19/04; C09K 19/56; C09K 19/38; C09K 19/3809; Y10T 428/10; Y10T 428/1005; Y10T 428/1009; Y10T 428/1018; Y10T 428/1023; Y10T 428/1027; Y10T 428/1032; B32B 2457/202; B32B 17/10504; B32B 2305/55
USPC ..... 349/38, 39, 123–136; 428/1.1, 1.2, 1.21, 428/1.25–1.28
See application file for complete search history.

(56) References Cited

U.S. PATENT DOCUMENTS

| | | | |
|---|---|---|---|
| 8,339,557 B2 | 12/2012 | Ishida | |
| 8,497,002 B2 | 7/2013 | Matsui et al. | |
| 8,619,104 B2 | 12/2013 | Umezaki et al. | |
| 9,188,811 B2 | 11/2015 | Matsui et al. | |
| 10,168,579 B2 | 1/2019 | Matsui et al. | |
| 2001/0048498 A1 | 12/2001 | Tomioka et al. | |
| 2003/0103172 A1 | 6/2003 | Ohe et al. | |
| 2004/0008299 A1 | 1/2004 | Fujimaki et al. | |
| 2004/0066480 A1 | 4/2004 | Yoshida et al. | |
| 2005/0200786 A1 | 9/2005 | Watanabe et al. | |
| 2005/0225701 A1 | 10/2005 | Fujimaki et al. | |
| 2005/0275784 A1 | 12/2005 | Ashizawa et al. | |
| 2009/0059110 A1 | 3/2009 | Sasaki et al. | |
| 2010/0039596 A1 | 2/2010 | Shin et al. | |
| 2010/0066961 A1 | 3/2010 | Matsui et al. | |
| 2011/0012203 A1* | 1/2011 | Jeong | H01L 27/12 257/351 |
| 2011/0042679 A1 | 2/2011 | Yamazaki et al. | |
| 2011/0075081 A1 | 3/2011 | Ishida | |
| 2011/0144299 A1 | 6/2011 | Yang et al. | |
| 2011/0199404 A1 | 8/2011 | Umezaki et al. | |
| 2011/0199565 A1 | 8/2011 | Kunimatsu et al. | |
| 2012/0149848 A1 | 6/2012 | Choi et al. | |
| 2012/0218199 A1 | 8/2012 | Kim et al. | |
| 2013/0215367 A1 | 8/2013 | Ito et al. | |
| 2013/0300967 A1* | 11/2013 | Matsui | |
| 2014/0043552 A1 | 2/2014 | Chang et al. | |
| 2014/0049736 A1 | 2/2014 | Guo et al. | |
| 2014/0184484 A1 | 7/2014 | Miyake et al. | |
| 2015/0194121 A1 | 7/2015 | Lee et al. | |
| 2016/0033825 A1 | 2/2016 | Matsui et al. | |
| 2016/0035760 A1 | 2/2016 | Ning et al. | |
| 2016/0230095 A1 | 8/2016 | Kang et al. | |
| 2016/0246399 A1 | 8/2016 | Huang et al. | |
| 2016/0294386 A1* | 10/2016 | Yang | G06F 3/0416 |
| 2019/0094628 A1 | 3/2019 | Matsui et al. | |

FOREIGN PATENT DOCUMENTS

| | | |
|---|---|---|
| JP | 2010-072011 A | 4/2010 |
| JP | 2011-059157 A | 3/2011 |
| KR | 10-2002-0046621 A | 6/2002 |
| KR | 10-2013-072011 A | 3/2013 |
| KR | 10-2013-0054780 A | 5/2013 |
| KR | 10-2014-0052451 A | 5/2014 |
| WO | WO 2011/099376 A1 | 8/2011 |

OTHER PUBLICATIONS

PCT International Search Report, PCT Application No. PCT/KR2015/007730, dated Nov. 17, 2015, 4 pages.

United States Office Action, U.S. Appl. No. 14/808,825, dated Mar. 27, 2018, 25 pages.

United States Office Action, U.S. Appl. No. 14/808,825, dated Nov. 13, 2017, 26 pages.

United States Office Action, U.S. Appl. No. 14/808,825, dated Jun. 23, 2017, 22 pages.

Korean Office Action, Korean Intellectual Property Office Patent Application No. 10-2014-0094867, May 20, 2020, 12 pages.

* cited by examiner $Rlc = R\_PAS3 + R\_PI$

DISPLAY DEVICE AND METHOD OF MANUFACTURING THE SAME

CROSS-REFERENCE TO RELATED APPLICATIONS

This application is a divisional application of U.S. patent application Ser. No. 14/808,825 filed on Jul. 24, 2015, which claims the priority benefit of Korean Patent Application No. 10-2014-0094867 filed on Jul. 25, 2014, which are incorporated herein by reference for all purposes as if fully set forth herein.

BACKGROUND OF THE INVENTION

Field of the Invention

The present invention relates to a display device and a method of manufacturing the same, and more particularly, to a display device which is capable of reducing power consumption by selectively driving the display device at a low refresh rate, and a method of manufacturing the same.

Discussion of the Related Art

A flat panel display's frame rate is defined by the number of image data refreshed on the screen per second. For example, a flat panel display with a frame rate of 60 Hz displays 60 frames of image data per second by providing gate and data signals to the gate lines and data lines on the flat panel.

The flat panel display's frame rate is closely related to the resolution (i.e., pixel count) of the flat panel display. Recently, resolution of flat panel displays often surpasses the FHD (Full-High-Definition: 1920×1080 resolution) and reaches to the QHD (Quad-High-Definition: 2560×1440), UHD (Ultra-High-Definition: 3840×2160) and more for clearer picture quality. However, increase in the resolution of the display panel means extra gate/data lines to be loaded with the gate/data signals, which in turn, increases the power consumption of the flat panel display.

SUMMARY OF INVENTION

The present invention provides a display device which can reduce power consumption by selectively adjusting the frame rate (refresh rate) under specified driving modes with minimal visual defects (e.g., flicker, line dim, etc.), and a method of manufacturing the same.

To achieve the above advantages, one embodiment of the present invention provides a display device comprising: a substrate; a thin film transistor positioned on the substrate and comprising a semiconductor layer made of a metal oxide; a first passivation layer positioned on the thin film transistor; an organic insulation layer positioned on the first passivation layer; a common electrode and a pixel electrode that are positioned on the organic insulation layer and apply a horizontal electric field to a liquid crystal layer, with a second passivation layer interposed between the common electrode and the pixel electrode; an auxiliary wire located adjacent to and connected to the common electrode; a third passivation layer positioned on the common electrode and the pixel electrode; a lower optical alignment layer positioned on the third passivation layer; and the liquid crystal layer positioned on the lower optical alignment layer.

One embodiment of the present invention provides a method of manufacturing a display device, the method comprising: forming a thin film transistor on a substrate, the thin film transistor comprising a semiconductor layer made of a metal oxide; forming a first passivation layer on the thin film transistor; forming an organic insulation layer on the first passivation layer and forming an auxiliary wire within the organic insulation layer; forming a common electrode on the organic insulation layer; forming a second passivation layer on the common electrode; forming a pixel electrode on the second passivation layer; forming a third passivation layer on the pixel electrode; and forming a lower optical alignment layer on the third passivation layer.

One embodiment of the present invention provides a display device comprising: a liquid crystal display panel comprising a thin film transistor formed on a substrate, a pixel electrode connected to the thin film transistor, a common electrode facing the pixel electrode and forming a horizontal electric field on the liquid crystal layer, a lower optical alignment layer being in contact with the liquid crystal layer, a passivation layer interposed between the lower optical alignment layer and either the pixel electrode or common electrode which is closer to the lower optical alignment layer, an upper substrate facing the substrate and comprising an upper optical alignment layer, and a liquid crystal layer interposed between the substrate and the upper substrate and containing negative liquid crystals; and a driver that applies a driving mode signal corresponding to image data to the liquid crystal display panel and runs in high refresh rate driving mode if the image data is a moving image and runs in low refresh rate driving mode if the image data is a still image.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF THE EMBODIMENTS

Hereinafter, exemplary embodiments of the present invention will be described with reference to the accompanying drawings.

Figure 1:
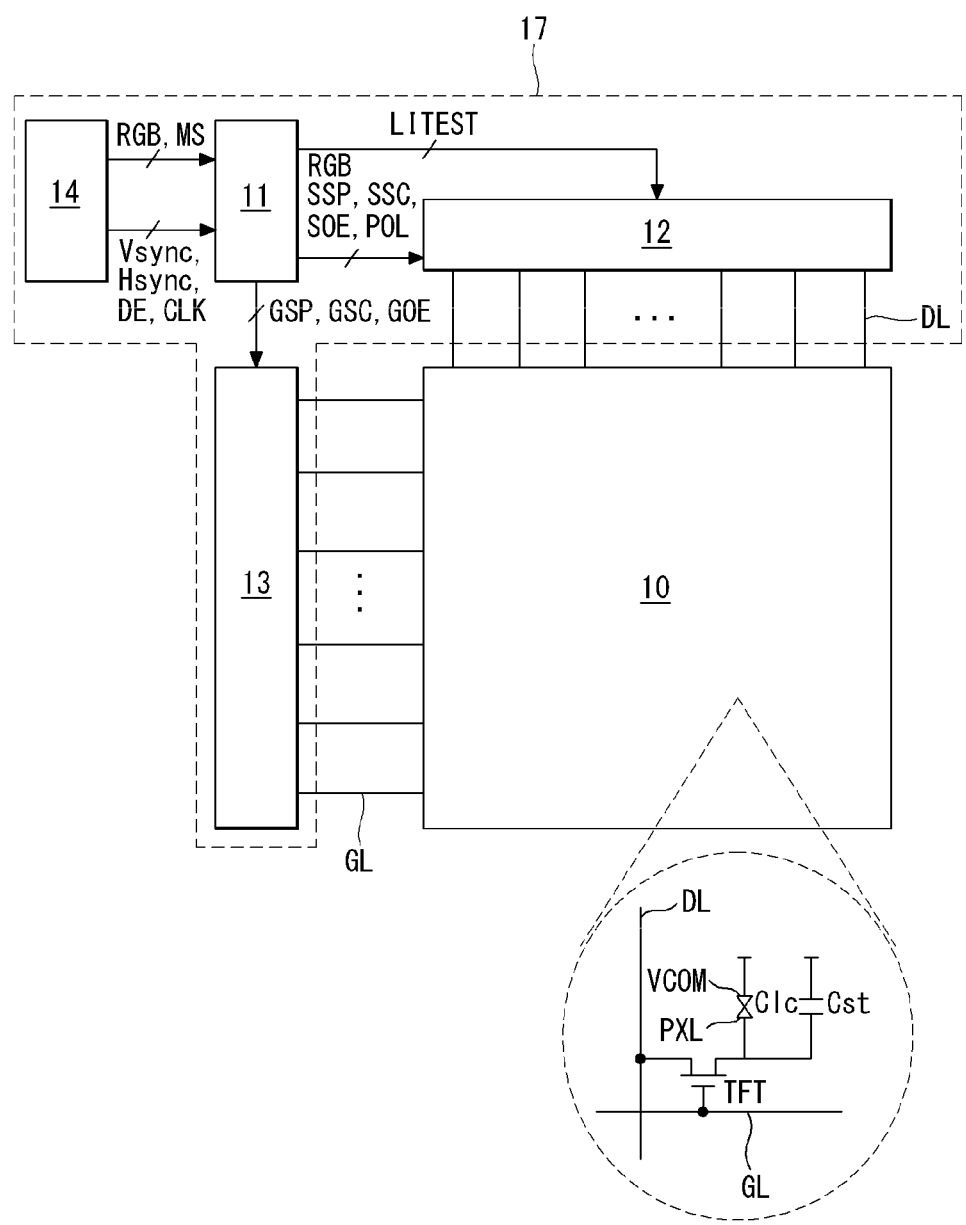
FIG. 1 is a block diagram of an exemplary display device according to an embodiment of the present invention.
Figure 2:
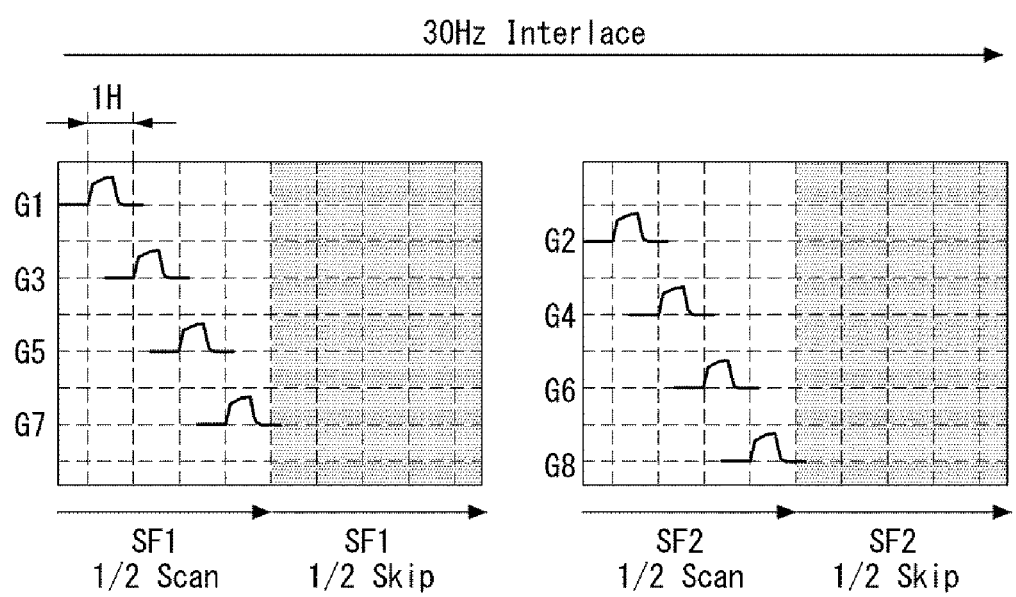
FIG. 2 is a timing diagram showing gate signals on the gate lines during exemplary 30 HZ interlaced driving mode.

FIG. 1 is a schematic block diagram of an exemplary display device according to an embodiment of the present invention. FIG. 2 is a timing diagram that shows an illustrative operation of the display device according to an embodiment of the present invention.

Referring to FIG. 1, a display device according to the present invention may be implemented as a flat panel display such as a liquid crystal display (LCD).

Referring to FIG. 1, a display panel 10 comprises a plurality of pixels provided with a liquid crystal layer formed between two substrates. Each pixel includes a thin film transistor TFT, which is connected to a data line DL and a gate line GL formed on one of the substrate. Each pixel also comprises a pixel electrode PLX connected to the TFT and a common electrode VCOM that are arranged to generate electric field to control the liquid crystal molecules. The thin film transistor TFT of the pixel is turned on by the gate signal on the gate line GL so that the liquid crystal capacitor Clc and the storage capacitor Cst of the pixel are charged according to the data signal on the data line DL.

A black matrix and a plurality of color filters (e.g., red (R), green (G), blue (B) color filters) may be provided on one of the two substrates forming the liquid crystal display panel 10. Each of the substrates forming the liquid crystal display panel 10 may be provided with a polarizer. Also, an optical alignment layer for setting a pre-tilt angle of liquid crystal molecules is provided on at least one of the substrates. The liquid crystal display panel 10 of the present invention can be implemented in various types, including but not limited to, the in-plane switching (IPS) type, the fringe field switching (FFS) type and the vertical alignment (VA) type. As such, the pixel electrode PXL and the common electrode VCOM may be provided on the same substrate and arranged to generate horizontal electric field according to the IPS (in-plane switching) mode or FFS (fringe field switching) mode. Also, the pixel electrode PXL and the common electrode VCOM may be provided on the opposite substrate from one another to generate vertical electric field for the liquid crystal display panel 10 operating in the VA mode. A backlight unit can be provided in the liquid crystal display panel. The backlight unit may be implemented as a direct-type backlight unit or an edge-type backlight unit.

The display device of the present invention comprises a driving circuitry 17 for providing gate signals and data signals on the gate lines GL and the data lines DL, respectively. To this end, the driving circuitry 17 may comprise a timing controller 11, a source driver 12, a gate driver 13 and a host system 14. The source driver 12 and the gate driver 13 may be mounted on the liquid crystal display panel 10 using COG (chip on glass) or COF (chip on layer) scheme, or may be formed directly on the substrate according to a gate driver-in panel (GIP) scheme.

The timing controller 11 receives digital video data RGB of an input image from the host system 14 through an LVDS (low voltage differential signaling) interface, and supplies the digital video data RGB of this input image to the source driver 12 through a mini-LVDS interface. Also, the timing controller 11 receives a driving mode signal MS from the host system 14. The timing controller 11 aligns digital video data RGB input from the host system 14 according to the layout and configuration of the pixel array and then supplies it to the source driver 12.

The timing controller 11 receives timing signals, such as a vertical synchronization signal Vsync, a horizontal synchronization signal Hsync, a data enable signal DE, and a dot clock CLK, from the host system 14 and generates control signals for controlling the operation timing of the source driver 12 and the gate driver 13. The control signals comprise a gate timing control signal for controlling the operation timing of the gate driver 13 and a source timing control signal for controlling the operation timing of the source driver 12.

The gate timing control signal may include a gate start pulse GSP, a gate shift clock GSC, a gate output enable signal GOE, etc. In operation, the gate start pulse GSP and the gate shift clock GSC is supplied to the gate driver 13 to generate gate signals for the gate lines GL. The gate output enable signal GOE may also be used to control the output of the gate signals from the gate driver 13.

The source timing control signal may include a source start pulse SSP, a source sampling clock SSC, a polarity control signal POL, a source output enable signal SOE, etc. The source start pulse SSP controls the data sampling start timing of the source driver 12. The source sampling clock SSC controls the sampling timing of data in the source driver 12 based on its rising or falling edge. The polarity control signal POL controls the polarities of data voltages sequentially output from each of source driver 12. The source output enable signal SOE controls the output timing of the source driver 12.

The driving circuitry 17 may be configured to operate in a plurality of driving modes depending on the driving mode signal MS. The driving mode signal MS may be a signal that controls the frequency in which the gate lines GL and/or the data lines DL are provided with an appropriate signals from the respective drivers. Accordingly, the frame rate of the liquid crystal display panel 10 can be selectively increased or decreased according to the driving mode signal MS generated by host system 14.

In some embodiments, the driving mode signal MS may change based on whether the content to be displayed on the liquid crystal display panel 10 is a moving image or a still image. For example, the driving circuitry 17 may operate in a driving mode that provides the gate signal and/or the data signal on the gate line GL and/or the data line DL at a first frequency when the stream of image data RGB from the system indicates a moving image. The driving circuitry 17 may operate in a driving mode that provides the gate signal and/or the data signal on the gate lines GL and/or data lines DL at a second frequency when the stream of image data RGB is a still image.

In some embodiments, the driving mode signal MS may be supplied from the external system. By way of an example, the host system 14 can receive image data RGB from an external system, and provides a driving mode signal MS to the timing controller 11 corresponding to the content to be displayed on the liquid crystal display panel 10.

Progressive scan or interlaced scan methods can be used in operating the display device. When using the interlaced scanning method, the timing controller 11 properly generates a gate timing control signal and a source timing control signal so that image data RGB provided at a frequency of 60 Hz, for example, is refreshed on the pixel array of the liquid crystal display panel 10 based on a frequency of 60×1/n Hz (n is a positive integer). As such, the timing controller 11 time-divides one frame into n sub-frames (n is a positive integer equal to or greater than 2), and divisionally drives the gate lines GL in each sub-frame, thereby implementing interlacing. The timing controller 11 groups the gate lines DL into n gate groups and matches the n gate groups to the n sub-frames, respectively, according to the order in which the n gate groups are driven.

In some embodiments, the timing controller 11 controls the operation of the gate driver 13 in each sub-frame and completes a sequential scan of the gate lines included in the corresponding gate group during a '1/n' period of one sub-frame. Further, the timing controller 11 generates a buffer operation control signal LITEST and cuts off a driving power (for example, a high-potential driving voltage and a ground-level voltage) applied to the buffers of the source driver 12 during the remaining '(n−1)/n' period of the one sub-frame, excluding the '1/n' period. In other words, the timing controller 11 may be configured to control the source driver 12 to stop running during a skip period, and cuts off the driving power applied to the source driver 12 to eliminate the static current flowing through the buffers of the source driver 12. In this way, the power consumption of the source driver 12 can be reduced drastically.

The source driver 12 comprises a shift register, a latch array, a digital-to-analog converter, an output circuit, and the like. The source driver 12 latches the image data RGB in response to the source timing control signal and converts the latched data into positive and negative analog gamma compensation voltages. The source driver 12 then supplies the data voltages, the polarities of which are inverted in a predetermined cycle, to the data lines DL through a plurality of output channels. The output circuit comprises a plurality of buffers. The buffers are connected to the output channels, and the output channels are connected to the data lines DL on a one-to-one basis. In controlling the polarities of the data voltage, the source driver 12 may adopt various driving schemes to reduce the power consumption of the source driver 12.

By way of an example, the source driver 12 may control the polarities of the data voltages provided on the output channels through a column inversion scheme so as to reduce the power consumption of the source driver 12. According to the column inversion scheme, the polarity of a data voltage output from the same output channel is inverted every sub-frame, and the polarities of data voltages output from adjacent output channels are opposite to each other.

The gate driver 13 supplies gate pulses to the gate lines DL in response to gate timing control signals using a shift register and a level shifter through the aforementioned progressive or the interlace driving schemes.

One gate time (which indicates the charging time of pixels on one horizontal line) required to scan one gate line in 60/n Hz interlacing is n times longer than one gate time '1 H' (herein, defined by one frame divided by the number of gate lines) in 60 Hz normal driving. In some embodiments, however s, one gate time in 60/n Hz interlacing can be set to '1 H', the same value as normal driving.

For example, as shown in FIG. 2, in 30 Hz interlacing in which one frame is time-divided into two sub-frames, one gate time can be set to 2 H. However, it is also possible to configure the gate driver 13 such that one gate time is set to 1 H, and the rising time of each gate pulse is earlier by 1 H.

Regardless of the scanning method used by the display device, the timing controller 11 can control the source driver 12 and the gate driver 13 to implement a plurality of driving modes with different frame rates. Both the progressive scan and the interlaced scan can have a similar degree of power consumption by adopting multiple frame rate driving mode scheme.

As described above, the odd horizontal lines and the even horizontal lines are driven at two different times in the interlace scan method, and thus the brightness difference caused by polarity inversion is distributed between the horizontal lines of the odd sub-frame and the even sub-frame, which makes it difficult for the user to perceive flickers caused by the brightness difference. For this reason, the interlaced scan method can have some advantage over the progressive scan method for the reduced frame rate mode. However, this advantage only goes so far as it merely alters the perception rather than suppressing the occurrence of the flicker itself.

Figure 3:
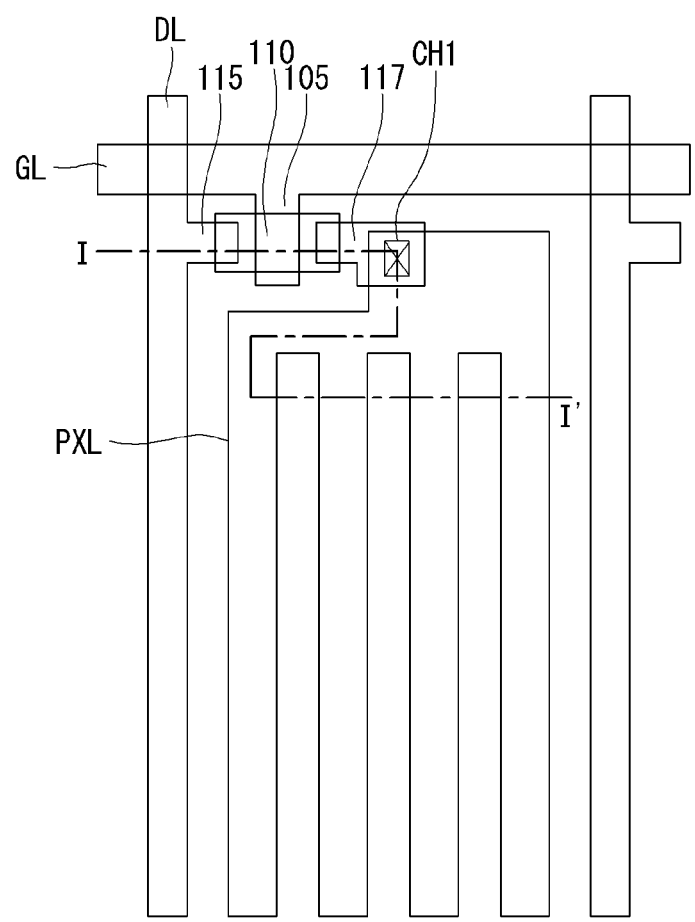
FIG. 3 is a top plan view showing an exemplary configuration of a sub-pixel in a display device according to an embodiment of the present invention.
Figure 4:
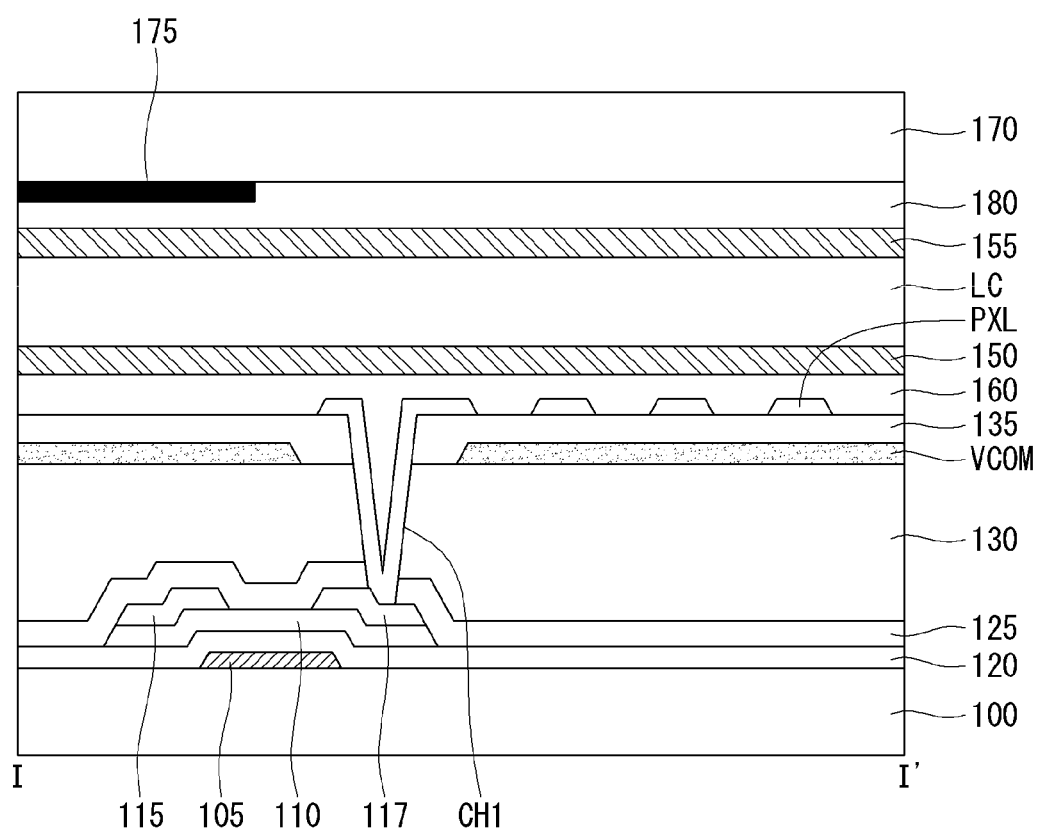
FIG. 4 is a cross-sectional view taken along the line I-I' of FIG. 3.

FIG. 3 is a top plan view showing a sub-pixel of a display device according to a first exemplary embodiment of the present invention. FIG. 4 is a cross-sectional view taken along the line I-I' of FIG. 3.

Referring to FIG. 3, a sub-pixel region is defined by the intersection of a gate line GL and a data line DL. In the sub-pixel region, a thin film transistor TFT consisting of a gate electrode 105 from the gate line GL, a source electrode 115 from the data line DL, a drain electrode 117 spaced apart from the source electrode 115, and a semiconductor layer 110 arranged between the source electrode 115 and the drain electrode 117. Further, a pixel electrode PXL connected to the drain electrode 117 of the thin film transistor TFT in the sub-pixel region. A common electrode VCOM (not shown) is arranged to face the pixel electrode PXL.

More specifically, the display device according to the exemplary embodiment of the present invention will be described below with reference to FIG. 4, which is a cross-sectional view taken along the line I-I' of FIG. 3.

Referring to FIG. 4, a thin film transistor TFT consisting of a semiconductor layer 110, a gate electrode 105, a source electrode 115, and a drain electrode 117 is formed on a substrate 100. First, the gate electrode 105 is positioned on the substrate 100. The gate electrode 105 can be formed in a single layer or a stack of multiple layers. The layer(s) of the gate electrode 105 may be formed of molybdenum (Mo), aluminum (Al), chrome (Cr), gold (Au), titanium (Ti), nickel (Ni), copper (Cu), and an alloy thereof. A gate insulation layer 120 is positioned on the gate electrode 105. The gate insulation layer 120 may include a silicon oxide (SiOx) layer, a silicon nitride (SiNx) layer, and a combination thereof.

The semiconductor layer 110 is positioned on the gate insulation layer 120. The semiconductor layer 110 may be made of a metal oxide semiconductor material, for example, zinc oxide ZnO, indium zinc oxide (InZnO), indium gallium zinc oxide (InGaZnO), zinc tin oxide (ZnSnO), and the like. Such metal oxide semiconductor materials exhibit much lower off current than that of silicon based semiconductor materials (e.g., amorphous silicon, poly-silicon). For example, semiconductor layer 110 that is formed of the metal oxide semiconductor material may have an off current I off of about 10-13 mA, and the semiconductor layer formed of amorphous silicon may have an off current of 10-11 mA. The superior off current characteristic of the metal oxide semiconductor based semiconductor layer 110 enables the pixels to maintain the charge (i.e., image data) even when the display device operates in a mode which reduces the frame rate. In another words, the use of the semiconductor layer 110 made of a metal oxide can reduce flicker (i.e., rapid change in the brightness of the pixels due to a leakage from the storage capacitor) during the prolonged period of a frame. Accordingly, the display device can operate at a decreased frame rate to achieve a desired power consumption level with minimal visual defects.

The source electrode 115 and the drain electrode 117 are positioned on the semiconductor layer 110. The source electrode 115 is brought into contact with one side of the semiconductor layer 110, and the drain electrode 117 is brought into contact with the other side of the semiconductor layer 110. The source electrode 115 and the drain electrode 117 may comprise a single layer or multiple layers of one or more of aluminum (Al), molybdenum (Mo), tungsten (W), titanium (Ti), and an alloy thereof. In some embodiments, any one or both of the source electrode 115 and the drain electrode 117 may be formed of a stack of a molybdenum layer, an aluminum layer and a molybdenum (Mo/Al/Mo). In some other embodiments, any one or both of the source electrode 115 and the drain electrode 117 may include a stack of a titanium layer, an aluminum layer and a titanium layer (Ti/Al/Ti).

A first passivation layer 125 is positioned on the thin film transistor TFT. The first passivation layer 125 insulates and protects the underlying elements, such as the semiconductor layer 110, the source electrode 115 and the drain electrode 117. The first passivation layer 125 covering at least some part of the TFT may be formed of a silicon oxide (SiOx) layer, a silicon nitride (SiNx) layer, or a stack of a silicon oxide (SiOx) layer and a silicon nitride (SiNx) layer.

An organic insulation layer 130 is positioned on the first passivation layer 125. The organic insulation layer 130 of the present invention is a planarization layer that provides a planar surface over the underlying structures. Accordingly, the organic insulation layer 130 may be made of organic materials that is capable of forming a planar surface, for example, polyimide, polyacryl, photoacryl, polyamide, BCB (benzocyclobutane), and the like.

A common electrode VCOM is positioned on the organic insulation layer 130. The common electrode VCOM serves as a common electrode for applying an electric field to the liquid crystal layer in terms of sub-pixels. Although not shown in FIG. 4, the common electrode VCOM is connected to a common line and receives a driving signal (e.g., common voltage signal). As shown in FIG. 4, the common electrode VCOM can be divided into several blocks.

In the embodiments where the common electrode VCOM is divided into a plurality of blocks, some blocks of the common electrode VCOM can be selectively grouped together to provide a mutual capacitance touch sensor including a plurality of touch driving lines (e.g., TX lines or TX channels) and touch sensing lines (e.g., RX lines or RX channels). Here, grouping of the common electrode blocks can be achieved by interconnecting the common lines.

In some embodiments, the common electrode blocks can be configured to provide a self-capacitance touch sensor in which each of the common electrode blocks becomes a point for identifying the location of the touch input. For the self-capacitance touch sensor, each of the common electrode blocks can be connected to a discrete common line without being grouped together, so that the location of the touch input can be identified on the basis of individual common electrode block.

The common electrode VCOM may be made of a transparent conductive material, such as ITO (indium tin oxide), IZO (indium zinc oxide), ITZO (indium tin zinc oxide), ZnO (zinc oxide), or IGZO (indium gallium zinc oxide), which light can pass through. A second passivation layer 135 is positioned on the common electrode VCOM. The second passivation layer 135 insulates the common electrode VCOM and the pixel electrodes PXL from each other. The second passivation layer 135 may be formed of a silicon oxide (SiOx) layer, a silicon nitride (SiNx) layer, or stacks of such layers.

The pixel electrode PXL is positioned on the second passivation layer 135. The pixel electrode PXL is connected to the drain electrode 117 of the thin film transistor TFT through a contact hole CH1 formed in the first passivation layer 125, organic insulation layer 130, and second passivation layer 135. Like the common electrode VCOM, the pixel electrode PXL may be made of a transparent conductive material, such as ITO, IZO, ITZO, ZnO, and IGZO, which the light can pass through. The pixel electrode PXL, together with the common electrode VCOM, generates an electric field to control the liquid crystal layer.

To maintain the pixel's charge corresponding to the image data RGB during reduced frame rate mode, it is very important to suppress a leakage from the liquid crystal capacitor Clc as well as the storage capacitor Cst. For this reason, an alignment layer with a high voltage holding ratio (VHR) and high resistance characteristics is preferred. Also, the liquid crystal layer with high VHR is preferred to implement a reduced frame rate mode in a display device.

In the exemplary embodiments of the present invention, a lower optical alignment layer 150 and an upper optical alignment layer 155 are made of a polymer material containing a photo-reactive material. For example, the optical alignment layers 150 and 155 may be made of a polyimide containing a photo-degradable/photo-decomposable material, such as cyclobutane dianhydride (CBDA). In the present disclosure, the term photo-degradable and the term photo-decomposable is used interchangeably. As these alignment layers are irradiated with UV light, cyclobutane dianhydride at a specific site is photo-degraded into maleimide. The polyimide chains in the optical alignment layers are broken by this reaction, making the surfaces of the alignment layers anisotropic.

In general, the optical alignment layer is formed as a polyimide alignment layer obtained by imidizing a polyimide precursor by heat treatment or calcination. In case of the conventional polyimide alignment layer, the precursor for the polyimide was either polyamic acid or a mixture of polyamic acid and polyamic acid ester. During the imidization process, some portion of the polyamic acid in the precursor is not imidized into polyimide due to the reverse reaction, and transform back into dianhydride and diamine. Thus, the length of the polyimide chains in the alignment layer tends to be shorter, which would lower the weight average molecular weight of the alignment layer. The anchoring force of the alignment layer is reduced as the weight average molecular weight of polyimide in the alignment layer is decreased.

Although the reverse reaction rate of polyamic acid ester is not as high as polyamic acid, increasing the content rate of polyamic acid ester in the precursor mixture for the polyimide causes various problems such as reduced rigidity and reduced adhesion of the alignment layer in the display panel. Moreover, using the mixture of the polyamic acid and polyamic acid ester as the precursor of the polyimide increases the imidization process (e.g., as much as 10 times longer than the imidization process using the polyamic acid alone).

To solve this problem, the polyimide of the optical alignment layers is formed from a precursor that comprises the polyamic acid or the mixture of polyamic acid and polyamic acid ester, as well as a predetermined amount of polyimide (i.e., pre-imidized polyimide). In the course of heating the precursor to carry out imidization of the polyamic acid or the mixture of polyamic acid and polyamic acid ester, the pre-imidized polyimide in the precursor does go through the reverse reaction.

As such, the resulting polyimide in the optical alignment layer has a longer chain length than the polyimide imidized from the precursor that did not include the pre-imidized polyimide therein. Therefore, the alignment layers of the present invention have a much higher weight average molecular weight and offer a higher anchoring force, as compared to the conventional alignment layer formed from the precursor that includes polyamic acid or a mixture of polyamic acid and polyamic acid ester, without the pre-imidzed polyimide. By mixing the pre-imidized polyimide in the precursor for the polyimide, the content ratio of the polyamic acid ester in the precursor can be reduced, and minimize the problems accompanied by excess polyamic acid ester.

The alignment layers used in the exemplary embodiments of this invention will be described in further detail. A polyimide alignment layer is produced using a mixed solution of a polyimide having a molecular weight (Mw) of 100,000 Da or greater and containing a photodegradable functional group (cyclobutane) and a polyimide precursor without the photodegradable functional group. That is, the alignment layers are formed using a precursor solution made from a mixture of a soluble polyimide and a polyimide precursor (e.g., polyamic acid). Although the soluble polyimide contained in the precursor solution has the photodegradable functional group, the polyimide precursor (e.g., polyamic acid) contained in the precursor solution has no photodegradable functional group.

Phase separation occurs when the precursor solution is applied onto the substrate; materials with high weight average molecular weight sink to the lower phase and materials with low weight average molecular weight forms the upper phase. Accordingly, the lower phase includes the polyamic acid, which has a higher weight average molecular weight than the soluble polyimide (i.e., pre-imidized polyimide) that forms the upper phase. In other words, the upper phase comprises the polyimide containing a photodegradable functional group and the lower phase comprises the polyimide precursor without the photodegradable functional group. Heat treatment is performed on the layer of the precursor solution, which is settled into the aforementioned two phases.

When the imidization process is carried out by the heat treatment, the upper phase, which comprises pre-imidized polyimide is simply dried, but the polyimide precursor (e.g., polyamic acid or the mixture of polyamic acid and the polyamic acid ester) in the lower phase of the precursor solution is imidized into polyimide. Since the polyimide precursor in the lower phase has no photodegradable functional group, the polyimide resulting from imidization of the lower phase also has no photodegradable functional group therein. On the other hand, the polyimide with the photodegradable functional group in the upper phase remains. Accordingly, the upper part of the alignment layer mostly comprises polyimide with the photodegradable functional group, whereas the lower part of the alignment layer mostly comprises polyimide without the photodegradable functional group.

Also, the polyimide in the upper part of the alignment layer tends to have higher weight average molecular weight than the polyimide in the lower part of the alignment layer. Even though the weight average molecular weight of the polyimide precursor was higher than the weight average molecular weight of the pre-imidized polyimide, the above described reverse reaction of the polyimide precursor during the imidization process causes the resulting polyimide from the precursor to have a lower molecular weight than that of the pre-imidized polyimide.

To simply put, the upper part of the optical alignment layer includes polyimide with the photodegradable material and has higher weight average molecular weight than the lower part of the optical alignment layer. The lower part of the alignment layer includes polyimide without photodegradable material and has lower weight average molecular weight than the upper part of the alignment layer.

As discussed above, the photodegradable material such as cyclobutane dianhydride (CBDA) contained in the polyimide on the upper part of the alignment layer is degraded/decomposed into maleimide by UV light irradiation to provide anisotropic property. With the anisotropy provided on the upper part of the optical alignment layer, which is the part closer to the liquid crystal layer, the optical alignment layer can have the anchoring force sufficient to set the pre-tilt angle of the liquid crystal. However, the upper part of the lower optical alignment layer containing mostly the polyimide with the photodegradable material exhibits higher resistivity than the lower part of the optical alignment layer mostly containing the polyimide containing without the photodegradable functional group.

Using a polyimide precursor containing a photodegradable functional group, an optical alignment layer with high resistivity can be obtained; however, an alignment layer with excessively high resistivity also causes problems such as image sticking. Excessive photodegradable material in the alignment layer can result in too much alkynyl groups present in the alignment layer, which can negatively affect the performance of the negative liquid crystal used in the display device. It is not an easy task to adjust the resistivity of the optical alignment layer to an appropriate level, especially in the display device provided with multiple frame rate modes.

For this reason, a third passivation layer 160 can be added between the lower optical alignment layer 150 and either the pixel electrode PXL or common electrode VCOM, whichever is closer to the lower optical alignment layer 150 to suppress pixel discharge.

As shown in FIG. 4, in the case of a pixel-top structure where the pixel electrode PXL is positioned over the common electrode VCOM, the third passivation layer 160 is provided between the pixel electrode PXL and the lower alignment layer 150 to suppress pixel discharge, in which the data voltage charged in the pixels is gradually decreased through the lower optical alignment layer 150. As a result, flicker causing a brightness difference between the pixels due to the pixel discharge can be reduced.

The third passivation layer 160 is made of silicon nitride (SiNx) or silicon oxide (SiOx). More specifically, the third passivation layer 160 may be a single layer of silicon nitride (SiNx), silicon oxide (SiOx), or a combination thereof. Also, the third passivation layer 160 may have the multi-layered structure as the above-described first passivation layer 125 and the second passivation layer 135. Moreover, the thickness of the third passivation layer 160 may be lower than that of the first passivation layer 125 and/or the second passivation layer 135. For instance, the third passivation layer 160 may have a thickness of about 500 Å to about 4,000 Å. Preferably, the third passivation layer 160 may have a thickness of about 2,000 to about 3,500 Å, and most preferably, the third passivation layer 160 may be about 3,000 Å. In addition, the third passivation layer 160 may have a minimum resistivity of 1E+14 Ωcm by adjusting the aforementioned layering structure or thickness.

The upper substrate 170 is provided on the opposite side of the liquid crystal layer LC such that the liquid crystal layer LC is sealed between the substrate 100 (i.e., lower substrate) and the upper substrate 170. A black matrix 175, color filters 180 and an upper optical alignment layer 155 may be provided on the surface of the upper substrate 170 facing the lower substrate 100. The black matrix 175 defines sub-pixel regions, and improves the contrast ratio by preventing color mixing. The color filters 180 are positioned in the sub-pixel regions defined by the black matrix 175. The color filters 180 transform the light from the light source into red (R), green (G), and blue (B) lights, thereby providing full-color display. The upper optical alignment layer 155 is interposed between the upper substrate 170 and the liquid crystal layer LC. The upper optical alignment layer 155 may be configured in the similar manner as the above-described lower alignment layer 150. That is, the lower part of the upper optical alignment layer 155 toward the liquid crystal layer LC may be substantially formed of polyimide with the photodegradable material and the upper part of the upper optical alignment layer 155 toward the upper substrate 170 may be substantially formed of polyimide without the photodegradable material. In some other embodiments, the upper optical alignment layer 155 may be formed from a precursor solution that contains polyimide precursor without the pre-imidized polyimide. In such cases, all parts of the upper optical alignment layer 155 may include the photodegradable material, whereas the lower optical alignment layer 150 is provided with an upper part having polyimide with the photodegradable material and a lower part having polyimide without the photodegradable material.

The liquid crystal layer LC containing liquid crystals is positioned between the above-described substrate 100 and the upper substrate 170. Liquid crystals are grain-shaped and have a long axis and a short axis that have different dielectric constants. If the long axis has a higher dielectric constant than the short axis, the liquid crystals are called positive liquid crystals. On the contrary, if the long axis has a lower dielectric constant than the short axis, the liquid crystals are called negative liquid crystals.

The liquid crystal layer LC of this invention may be negative liquid crystals. The negative liquid crystals have an advantage in preventing flicker as they are affected less by the flexo-effect than the positive liquid crystals. Also, the negative liquid crystals have a wider light transmission area since they move around the short axis when a voltage is applied. Because the negative liquid crystals have a higher light transmission rate than the positive liquid crystals, the luminance of the light source can be lowered to reduce the power consumption of the display device.

As described above, embodiments of the display device in the present disclosure can reduce its power consumption by employing the TFTs with metal oxide semiconductor layer, the optical alignment layer and the negative liquid crystal. Moreover, a passivation layer may be provided on the bottom surface of the optical alignment layer (i.e., the surface facing away from the liquid crystal layer) such that the optical alignment layer is not in direct contact with the pixel electrodes and the common electrode in the pixel area. This additional passivation layer can compensate the relatively low resistivity of the lower part of the optical alignment layer (i.e., the part substantially formed from the pre-imidized polyimide).

Accordingly, the third passivation layer 160 interposed between the optical alignment layer and the electrodes (i.e., the pixel and/or the common electrode depending on the pixel-top or VCOM-top configuration) suppresses the unwanted pixel discharge at the interface of the optical alignment layer and the electrode. As a result, pixels can hold charges for longer period of time before visually identifiable defects occurs by the leakage of the charges. In other words, the duration of which the pixels maintain their brightness over a certain level in a single frame can be extended. This makes it easy to reduce the frame rate of the display device.

Figure 5:
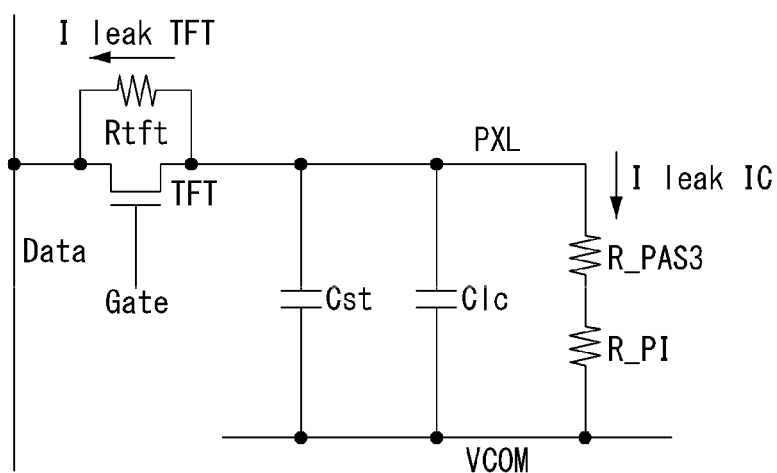
FIG. 5 is a circuit diagram according to the configuration of the sub-pixel depicted in FIG. 4.

FIG. 5 is a schematic circuit diagram illustrating the operation of a pixel provided with a passivation layer insulating the optical alignment layer from the pixel electrode and/or the common electrode. Referring to FIG. 5, the gate electrode of the TFT is connected to the gate line and the source electrode of the TFT is connected to the data line. The drain electrode of the TFT is connected to the pixel electrode PXL. The pixel electrode PXL and the common electrode VCOM are arranged to generate electrical field across the liquid crystal layer. When the TFT is turned on, the data signal from the data line DL is supplied to the pixel electrode. Difference in the voltage of the signals on the pixel electrode PXL and the common electrode VCOM generates capacitance, which is stored in the storage capacitor Cst and the liquid crystal capacitor Clc. During a part of a frame, the TFT is turned off and the pixel maintains the electric field across the liquid crystal by the charge stored in the storage capacitor Cst and the liquid crystal capacitor Clc.

As shown in FIG. 5, current leakage from the storage capacitor Cst and the liquid crystal capacitor Clc can occur on the TFT side as well as the liquid crystal side. To suppress the current leakage at the TFT side, the resistivity Rtft of the TFT can be increased by employing a semiconductor that has low off current property, such as the metal oxide semiconductor mentioned above. To suppress the current leakage at the liquid crystal side, the pixel electrode or the common electrode (whichever is closer to the optical alignment layer) is covered by a passivation layer (i.e., the third passivation layer 160). Accordingly, the resistance of the third passivation layer R_PAS3 is added to the resistance R_PI of the optical alignment layer. As such, pixel discharge during the reduced frame rate driving mode can be effectively suppressed by decreasing current leakage from the storage capacitor Cst and the liquid crystal capacitor Clc at the both ends described above.

Figure 6:
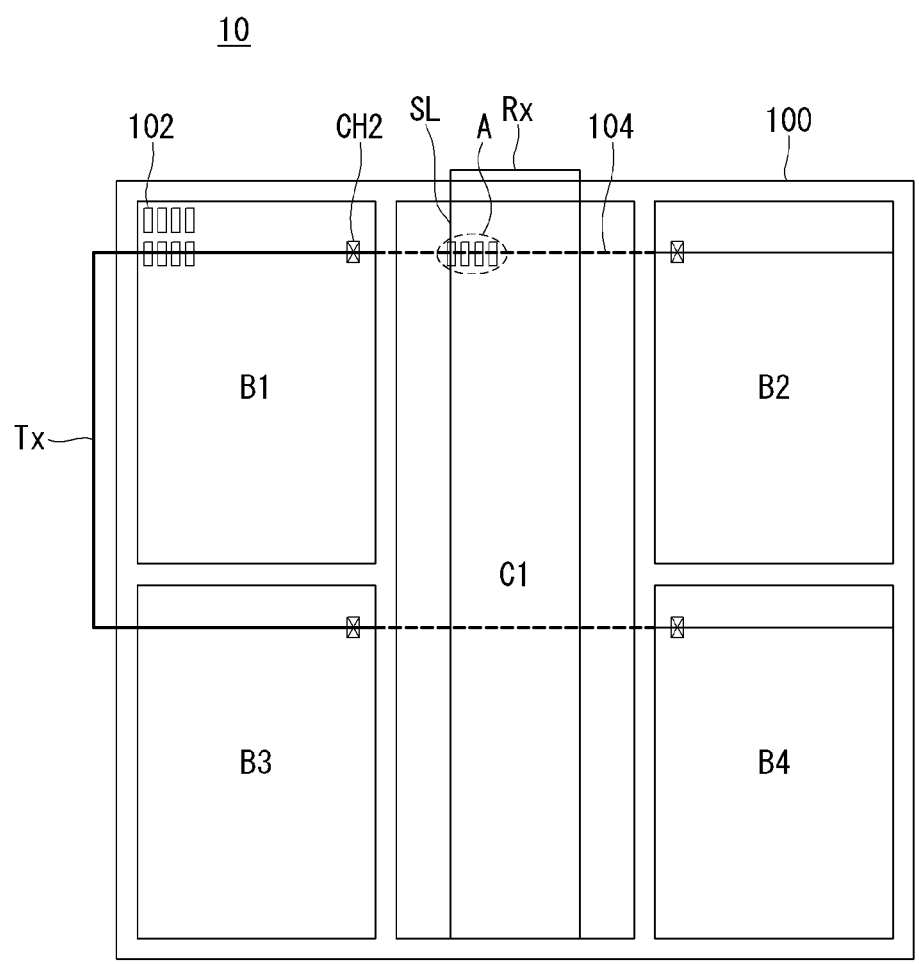
FIG. 6 is a top plan view showing an exemplary configuration of a display device according to an embodiment of the present invention.
Figure 7:
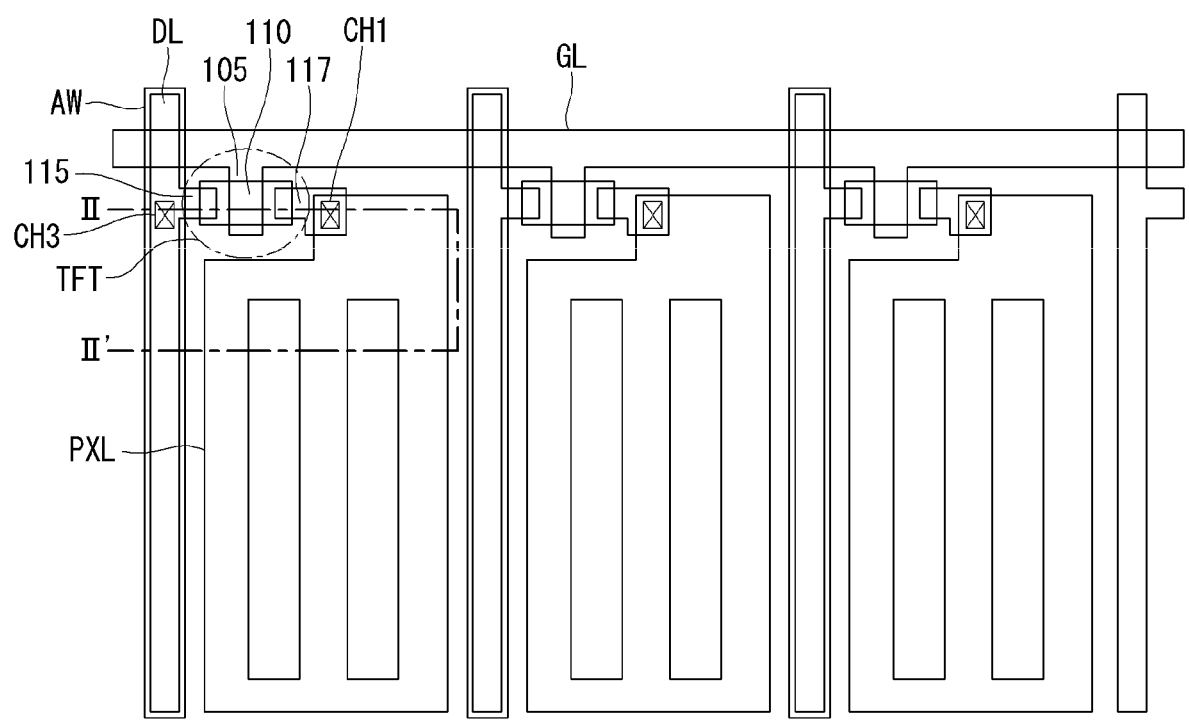
FIG. 7 is a schematic illustration of sub-pixels in the area "A" denoted in FIG. 6.
Figure 8:
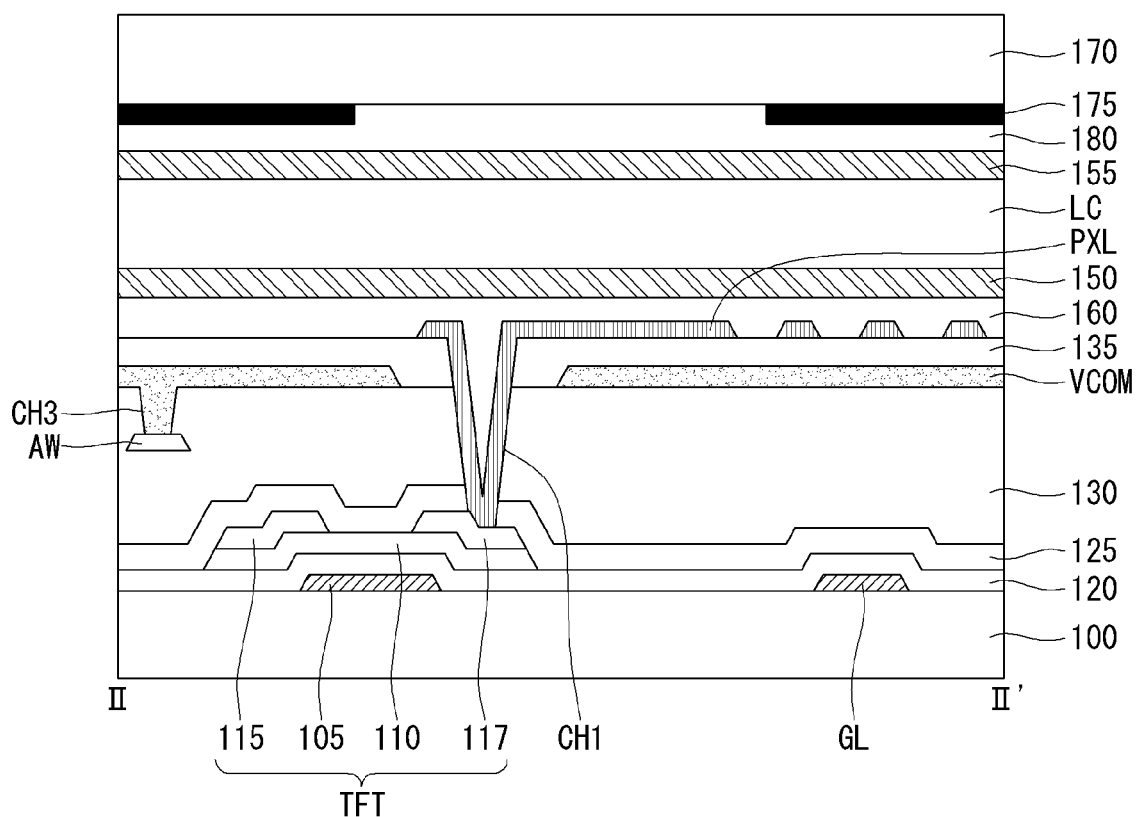
FIG. 8 is a cross-sectional view taken along the line II-II' of FIG. 7.

FIG. 6 is a top plan view showing an exemplary configuration of the common electrode in some embodiments of the display device. FIG. 7 is a top plan view showing the sub-pixels in the area A of FIG. 6. FIG. 8 is a cross-sectional view taken along the line II-II' of FIG. 7.

Charging the storage capacitor Cst and the liquid crystal capacitor Clc of the pixels with the corresponding image data of a frame can take less time than the entire length of a frame. As such, the remainder of the frame can be used to sense touch inputs made on the screen. In other words, a frame can include a pixel charging period and a touch scanning period. During the touch scanning period, the common electrode VCOM can be used to implement a mutual-capacitance or a self-capacitance touch sensor in the display device.

The example depicted in FIG. 6 is based on a mutual-capacitance. A mutual-capacitance based touch sensor includes a plurality of touch driving channels (i.e., TX channels) and a plurality of touch sensing channels (i.e., RX channels) that are arranged in a matrix pattern. The RX channels extend across the TX channels. For example, touch driving channels can be formed in rows while touch sensing channels can be formed in columns (e.g., orthogonal).

To implement a touch sensor in the liquid crystal display panel 10, the common electrode VCOM is segmented into a plurality of common electrode blocks. Each TX channel is defined by electrically connecting a plurality of common electrode blocks arranged in one direction. For instance, the common electrode blocks B1 and B2 can be electrically connected together to serve as a single TX channel as shown in FIG. 6. Likewise, the common electrode blocks B3 and B4 can be configured as another TX channel. Also, the RX channels can be formed of a common electrode block or defined by a group of common electrode blocks arranged in an orthogonal direction to the arrangement of the common electrode blocks forming the TX channels.

In the example depicted in FIG. 6, a common electrode block C1 extends in a column direction across the TX channels, and serves as a RX channel. For simpler explanation, only two TX channels and one RX channel are depicted in FIG. 6. Number of the TX channels and the RX channels in the display device can vary depending on the desired resolution of touch sensitivity. Since the TX channels and the RX channels are implemented by the common electrode blocks, the size of the common electrode blocks can also vary based on the resolution of touch sensitivity (i.e., the number of TX/RX channels). Accordingly, the size and the number of the common electrode blocks need not match those of the pixels. For the purpose of charging pixels during the pixel charging period, a single common electrode block can be shared among multiple pixels.

As part of the touch sensing operation, a touch driving signal (e.g., AC waveform) is applied to a group of common electrode blocks that form a TX channel. Providing the touch driving signal on the TX channel causes capacitive coupling at the intersections of the TX channel and the RX channel.

A touch input made on the display device changes the capacitive coupling at the intersection of the TX channel and the RX channel, and it changes the current that is carried by the RX channel. This information in a raw or in some processed form can be used to determine the locations of touch inputs on the display device. The touch driver performs this operation for each intersections of the TX and RX channels at rapid rate so as to provide multipoint touch sensing.

Grouping of the common electrode blocks B1 and B2 (or B3 and B4) for defining a TX channel is made by connecting wires 104. As shown in FIG. 6, the connecting wires 104 may be configured to bypass across the common electrode that functions as the RX channel (e.g., common electrode C1) without being connected thereto. As such, the connecting wires 104 can be configured to run underneath the common electrode blocks and covered by an organic insulation layer. The common electrode blocks of the same TX channel can be connected to the connecting wire 104 through the contact holes CH2.

Referring to FIG. 7, the sub-pixels located in the area A of FIG. 6 will be described. Each sub-pixel region is defined by the intersection of a gate line GL and a data line DL. A thin film transistor TFT is provided in each sub-pixel region. The thin film transistor TFT is provided with a gate electrode 105 from the gate line GL, a source electrode 115a from the data line DL, a drain electrode 117 spaced apart from the source electrode 115, and a semiconductor layer 110 arranged between the source electrode 115 and the drain electrode 117. Further, a pixel electrode PXL connected to the drain electrode 117 of the TFT and a common electrode (not shown) facing the pixel electrode PXL are arranged in each sub-pixel region. An auxiliary wire AW can be arranged between each sub-pixel region, and extend along the data line DL. The auxiliary wire AW and the data line DL may be arranged such that at least partially overlap each other. The auxiliary wire AW can be connected to a common electrode block via a contact hole CH3.

FIG. 8 is a cross-sectional view taken along the line II-II' of FIG. 7. Referring to FIG. 8, a gate electrode 105 and a gate line GL are positioned on a substrate 100. A gate insulation film 120 is positioned on the gate electrode 105 and the gate line GL. A semiconductor layer 110 is positioned on the gate insulation film 120. The present invention can reduce the power consumption of the display device and reduce flicker by the use of a semiconductor layer 110 made of a metal oxide. Meanwhile, a source electrode 115 and a drain electrode 117 are positioned on the semiconductor layer 110. The source electrode 115 is brought into contact with one side of the semiconductor layer 110, and the drain electrode 117 is brought into contact with the other side of the semiconductor layer 110. Accordingly, a TFT consisting of the semiconductor layer 110, the gate electrode 105, the source electrode 115, and the drain electrode 117 is formed on the substrate 100.

A first passivation film 125 is positioned on the TFT. The first passivation film 125 insulates and protects the underlying elements. The first passivation film 125 may be a silicon oxide film (SiOx), a silicon nitride film (SiNx), or a dual layer thereof. An organic insulation film 130 is positioned on the first passivation film 125. The organic insulation film 130 provides a planar surface over the underlying structure, and may be made of an organic material such as polyimide, polyacryl, photoacryl, polyamide, BCB (benzocyclobutane), etc.

An auxiliary wire AW can be positioned within the organic insulation film 130. The auxiliary wire AW can serve as a signal line for transmitting the touch sensing signals to the common electrode blocks. The auxiliary wire AW can also be used as a low resistance conductive path to alleviate voltage drops at the common electrode blocks distanced away from the signal source. As such, more uniform voltage level can be maintained throughout the common electrode blocks. In this regard, the auxiliary wire AW may be made of a low-resistance metal, for example, molybdenum (Mo), aluminum (Al), chrome (Cr), gold (Au), titanium (Ti), nickel (Ni), copper (Cu) and an alloy thereof.

The common electrode blocks VCOM are positioned on the organic insulation layer 130. As described above, the common electrode blocks VCOM serve as the common electrode VCOM for generating electric field across the liquid crystal layer LC during pixel charging period, and also serve as the touch sensor (i.e., TX/RX channels) during touch scanning period. Each of the common electrode blocks VCOM can be connected to the auxiliary wire AW through a contact hole CH3 formed in the organic insulation layer 130, and the common voltage can be applied to the common electrode block VCOM via the auxiliary wire AW. Also, the touch driving signal and the touch sensing signal for touch scanning operation can be transmitted to and from the common electrode blocks VCOM via the auxiliary wire AW. Further, the auxiliary wire AW can be used for interconnecting the common electrode blocks to form TX channels in a mutual capacitance touch sensor system.

A second passivation layer 135 is positioned on the common electrode blocks VCOM. The second passivation layer 135 is interposed between the layer of the common electrode blocks 130 and the layer of the pixel electrodes PXL to insulate one from another. The second passivation layer 135 may be made of the same material as the first passivation layer 125. As such, a pixel electrode PXL is positioned on the second passivation layer 135. The pixel electrode PXL is connected to the drain electrode 115 of the thin film transistor TFT via the contact hole CH1 formed through the first passivation layer 125, the organic insulation layer 130, and second passivation layer 135. The pixel electrode PXL, together with the common electrode block VCOM, forms an electric field across the liquid crystal layer LC.

third passivation layer 160, which has higher electrical resistance than the lower parts of the optical alignment layer, is provided over the pixel electrode PXL. The third passivation layer 160 may have the same structure as the above-described first passivation layer 125 and the second passivation layer 135. More specifically, the third passivation layer 160 may be a single layer of silicon nitride (SiNx) or silicon oxide (SiOx), or a combination of such layers. The thickness of the third passivation layer 160 may be from about 500 Å to about 4,000 Å. Preferably, the third passivation layer 160 may have a thickness of about 2,000 Å to 3,500 Å, and most preferably, about 3,000 Å. The thickness of the third passivation layer 160 is not limited as above. Considering the electric field generated by the pixel electrode PXL and the common electrode VCOM for controlling the liquid crystal layer LC, the third passivation layer 160 can be formed thinner than the first or the second passivation layers.

To compensate for the low resistance at the lower part of the optical alignment layer, it is preferred that the third passivation layer 160 has a minimum resistivity of 1E+14 Ω/cm. The resistivity of the third passivation layer 160 can be obtained by adjusting the material, the layering structure as well as the thickness of the third passivation layer 160.

A lower optical alignment layer 150 is positioned on the third passivation layer 160. The lower optical alignment layer 150 is made of a polymer material which is unidirectionally aligned by reacting to UV light. As mentioned, the third passivation layer 160 can be added between the lower optical alignment layer 150 and the pixel electrode PXL to compensate for the resistance of the lower part (i.e., the part closer to the third passivation layer 160) of the lower optical alignment layer 150.

Meanwhile, an upper substrate 170 is positioned to face the lower substrate 100. The upper substrate 170 comprises the black matrix pattern 175, the color filters 180, and the upper optical alignment layer 155. The black matrix pattern 175 and the color filters 180 defines the red (R), the green (G), and the blue (B) sub-pixel regions. The upper optical alignment layer 155 is positioned under the black matrix 175 and the color filters 180 to be interfaced with the liquid crystal layer. The upper optical alignment layer 155 can be formed in the same manner as the above-described lower alignment layer 150.

A liquid crystal layer LC containing liquid crystals is positioned between the above-described substrate 100 and the upper substrate 170. The liquid crystal layer LC of this invention has negative liquid crystals. The negative liquid crystals have a wider light transmission area since they move around the short axis when a voltage is applied. Accordingly, the present invention offers the advantage of reducing power consumption by improvement in brightness because the negative liquid crystals have a higher light transmission rate than the positive liquid crystals.

As described above, the display device according to the second exemplary embodiment of the present invention can reduce power consumption by comprising a metal oxide semiconductor layer 110, an optical alignment layer 150, 155, and negative liquid crystals LC. Moreover, the display device can suppress a pixel discharge involving a gradual decrease in the data voltage stored in the pixels by providing a high resistance passivation layer under the lower optical alignment layer 150 to suppress the current leakage from the pixel. As a result, the amount of pixel discharge can be reduced to avoid flicker or other visual defects even when the frame rate of the display device is reduced.

Figure 9:
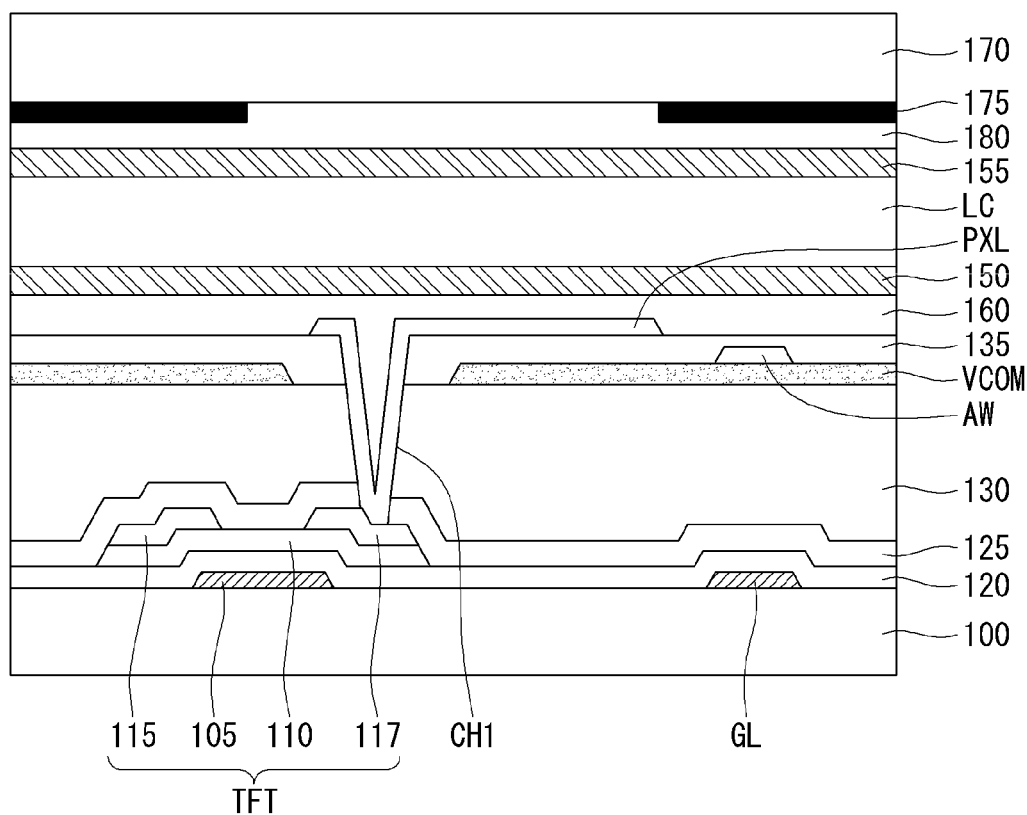
FIG. 9 is a cross-sectional view of an exemplary configuration of the display device, according to an embodiment of the present invention.

In FIG. 8, the auxiliary wire AW of a display panel 10 is positioned within the organic insulation layer 130 (e.g., planarization layer). However, the arrangement of the auxiliary wire AW is not limited as such, and the auxiliary wire AW may be provided under or above the organic insulation layer 130. FIG. 9 is a cross-sectional view showing an exemplary configuration of the auxiliary wire AW in some other embodiments of the display device.

Referring to FIG. 9, a gate electrode 105 and a gate line GL are positioned on a substrate 100. A gate insulation layer 120 is positioned on the gate electrode 105 and the gate line GL. A semiconductor layer 110 is positioned on the gate insulation layer 120, and a source electrode 115 and a drain electrode 117 are positioned on the source and the drain regions of the semiconductor layer 110, respectively. A first passivation layer 125 is positioned on the thin film transistor TFT, and an organic insulation layer 130 is positioned on the first passivation layer 125. A common electrode VCOM is positioned on the organic insulation layer 130, and an auxiliary wire AW is positioned in contact with the common electrode VCOM.

Unlike the configuration shown in FIG. 8, the auxiliary wire AW can be positioned directly on the upper surface of the common electrode VCOM. There is no insulation layer provided between the auxiliary wire AW and the common electrode VCOM, and they are connected directly to each other without a contact hole. Accordingly, the area of contact between the auxiliary wire AW and the common electrode VCOM becomes wider, and this makes it easy to provide low resistance conductive paths on the common electrode VCOM, which helps in maintaining uniform voltage level across the common electrode VCOM.

A second passivation layer 135 is positioned on the common electrode VCOM. A pixel electrode PXL is positioned on the second passivation layer 135 and connected to the drain electrode 117 of the thin film transistor TFT through a contact hole CH1. A third passivation layer 160 is positioned on the pixel electrode PXL, and a lower optical alignment layer 150 is positioned on the third passivation layer 160. An upper substrate 170 is positioned to face the lower substrate 100, and a black matrix 175 and color filters 180 are positioned on the upper substrate 170. The liquid crystal layer LC is positioned between the lower optical alignment layer 150 and the upper optical alignment layer 155.

Figure 10:
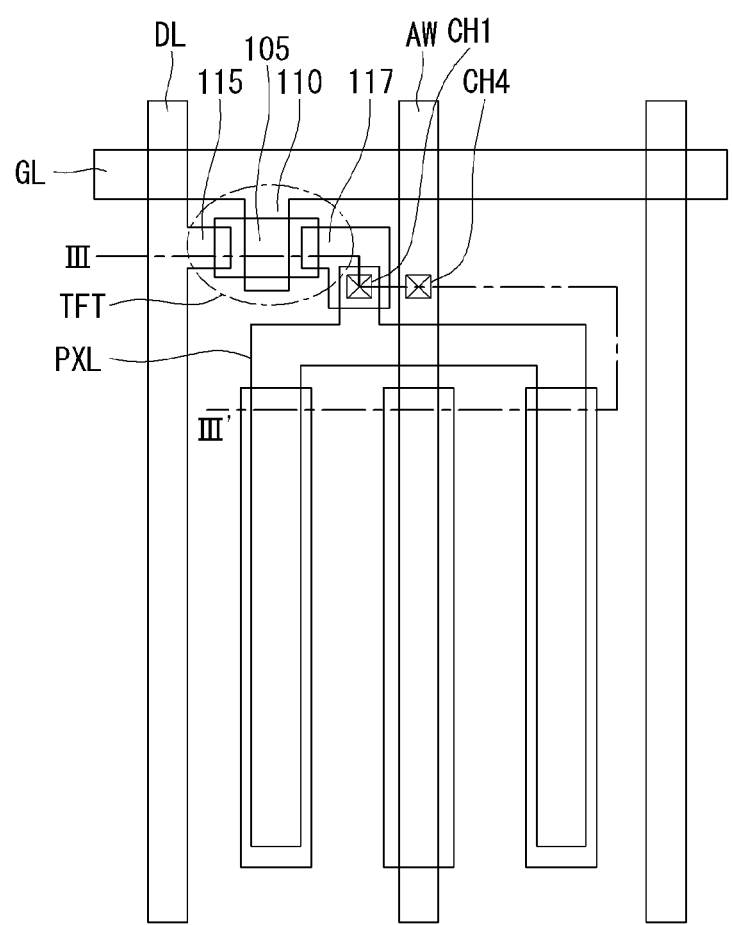
FIG. 10 is a top plan view showing a sub-pixel of a display device according to an embodiment of the present invention.
Figure 11:
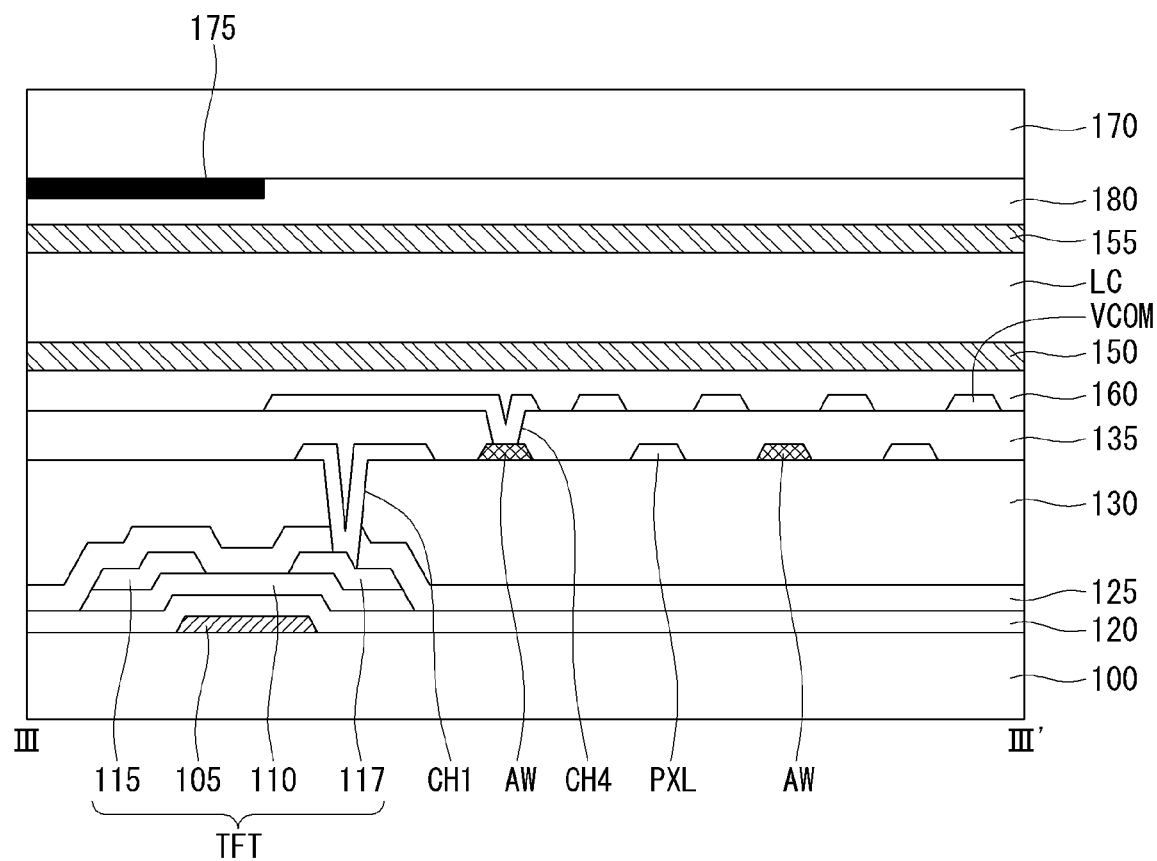
FIG. 11 is a cross-sectional view taken along the line III-III' of FIG. 10.

FIG. 10 is a top plan view showing an exemplary configuration of the sub-pixels in some embodiments of the present invention. FIG. 11 is a cross-sectional view of the display device taken along the line III-III' of FIG. 10.

Referring to FIGS. 10 and 11, a sub-pixel region is defined by the intersection of a gate line GL and a data line DL. In the sub-pixel region, a thin film transistor TFT consisting of a gate electrode 105 from the gate line GL, a source electrode 115 from the data line DL, a drain electrode 117 spaced apart from the source electrode 115, and a semiconductor layer 110 is arranged between the source electrode 115 and the drain electrode 117. Further, the drain electrode 117 of the thin film transistor TFT is connected to the pixel electrode PXL, which is arranged to face the common electrode VCOM.

A gate electrode 105 is positioned on a substrate 100, and a gate insulation layer 120 is positioned on the gate electrode 105. A semiconductor layer 110 made of a metal oxide is positioned on the gate insulation layer 120. A source electrode 115 and a drain electrode 117 are provided over the semiconductor layer 110. Accordingly, a thin film transistor TFT consisting of the semiconductor layer 110, the gate electrode 105, the source electrode 115, and the drain electrode 117 is formed. Although the thin film transistor TFT described in this disclosure has the inverted staggered structure, the thin film transistor TFT with a staggered structure having the gate electrode 105 positioned on the semiconductor layer 110 may also be used.

A first passivation layer 125 is positioned on the thin film transistor TFT, and an organic insulation layer 130 is positioned on the first passivation layer 125. The pixel electrode PXL is positioned on the organic insulation layer 130 and connected to the drain electrode 117 of the thin film transistor TFT via the contact hole CH1 through the organic insulation layer 130 and the first passivation layer 125. A second passivation layer 135 is positioned on the pixel electrode PXL, and a common electrode VCOM is positioned on the second passivation layer 135.

As shown in FIG. 11, some embodiments of the display device can employee a VCOM-top structure in which the common electrode VCOM is positioned on the pixel electrode PXL. In this case, the common electrode VCOM is positioned closer to the lower optical alignment layer 150 than the pixel electrode PXL. The third passivation layer 160 is interposed between the lower optical alignment layer 150 and the common electrode VCOM.

The auxiliary wire AW, which is formed on the same layer as the pixel electrode PXL, is positioned on the second passivation layer 135. The auxiliary wire AW is brought into contact with the common electrode VCOM through a contact hole CH4 formed in the second passivation layer 135. The third passivation layer 160 is positioned on the common electrode VCOM, and a lower optical alignment layer 150 is positioned on the third passivation layer 160. The black matrix 175 and the color filters 180 are provided on the surface of upper substrate 170 facing the substrate 100. The upper optical alignment layer 155 is positioned under the color filters 180, and the liquid crystal layer LC is positioned between the lower optical alignment layer 150 and the upper optical alignment layer 155.

An exemplary method of manufacturing a display device according to an embodiment of the present invention will be described in reference to FIGS. 12A to 12J.

Figure 12A:
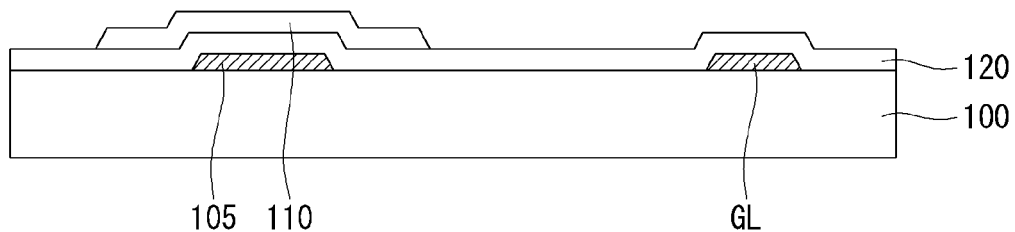
FIGS. 12A to 12J are cross-sectional views illustrating the states of a display device during manufacturing of the display device according to an exemplary embodiment of the present invention.

Referring to FIG. 12A, a first low-resistance gate metal layer is deposited on a substrate 100 and patterned to form the gate line GL and the gate electrode 105 extended from the gate line GL. The gate electrode 105 and the gate line GL may be a single layer made of aluminum (Al), molybdenum (Mo), tungsten (W), titanium (Ti), or an alloy thereof. The gate electrode 105 and the gate line GL may be formed of a multi-layer of the aforementioned materials. For instance, the gate electrode 105 and the gate line GL may be a stack of molybdenum/aluminum/molybdenum (Mo/Al/Mo) layers or a stack of titanium/aluminum/titanium (Ti/Al/Ti) layers.

A gate insulation layer 120 is formed on the gate electrode 105 and the gate line GL. The gate insulation layer 120 may be made of silicon nitride (SiNx), silicon oxide (SiOx), or a combination of them. A semiconductor layer 110 is formed by depositing a metal oxide on the gate insulation layer 120 and patterning the metal oxide. The metal oxide material of the semiconductor layer 110 may be zinc oxide (ZnO), indium zinc oxide (InZnO), indium gallium zinc oxide (InGaZnO), zinc tin oxide (ZnSnO) and the like.

Figure 12B:
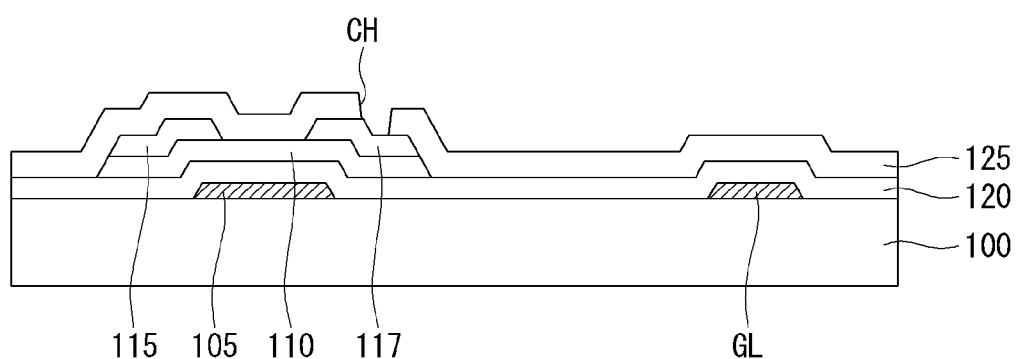

Referring to FIG. 12B, data lines, source electrodes and drain electrodes are formed with a second low-resistance metal layer. A part of a data line DL is extended to form the source electrode 115. The source electrode 115 and the gate electrode 105 are brought into contact with the source region and the drain region of the semiconductor layer 110, respectively. The second low-resistance metal layer forming the data line DL, source electrode 115 and the drain electrode 117 may be a single layer formed of aluminum (Al), molybdenum (Mo), tungsten (W), titanium (Ti), or an alloy thereof. The second low-resistance metal layer can be formed of a multi-layer of the aforementioned materials. For instance, the second low-resistance metal layer may be formed with a stack of molybdenum/aluminum/molybdenum (Mo/Al/Mo) layers or a stack of titanium/aluminum/titanium (Ti/Al/Ti) layers. Accordingly, a thin film transistor TFT consisting of the gate electrode 105, the semiconductor layer 110, the source electrode 115, and the drain electrode 117 is formed on the substrate 100.

A first passivation layer 125 is formed on the thin film transistor TFT. The first passivation layer 125 may be made of silicon nitride (SiNx), silicon oxide (SiOx), or a combination of them. A contact hole CH for exposing a part of the drain electrode 117 can be formed through the first passivation layer 125. It should be noted that other insulation layers (e.g., the organic insulation layer) will be provided over the first passivation layer 125. As such, the contact hole CH in the first passivation layer 125 for exposing the part of the drain electrode 117 can be formed after some of other insulation layers are provided on the first passivation layer 125.

Figure 12C:
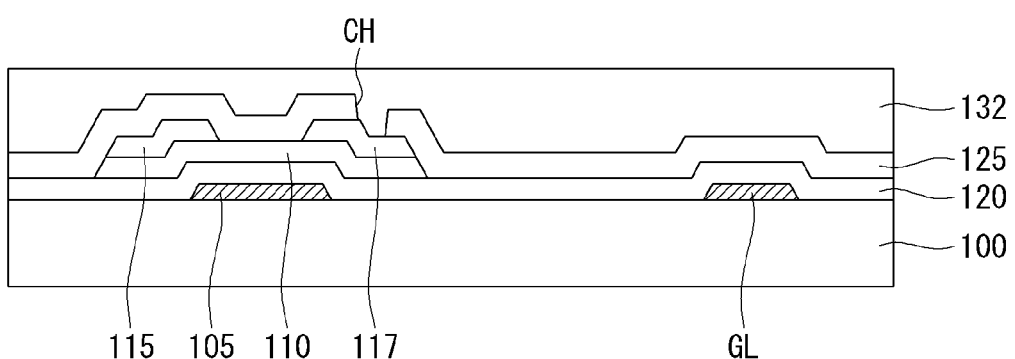

Referring to FIG. 12C, a lower organic insulation layer 132 is formed on the first passivation 125 to provide a planar surface over the thin film transistor TFT. The lower organic insulation layer 132 may be made of an organic material such as polyimide, polyacryl, photoacryl, polyamide, BCB (benzocyclobutane), and the like by a solution process such as spin coating, slit coating, etc.

Figure 12D:
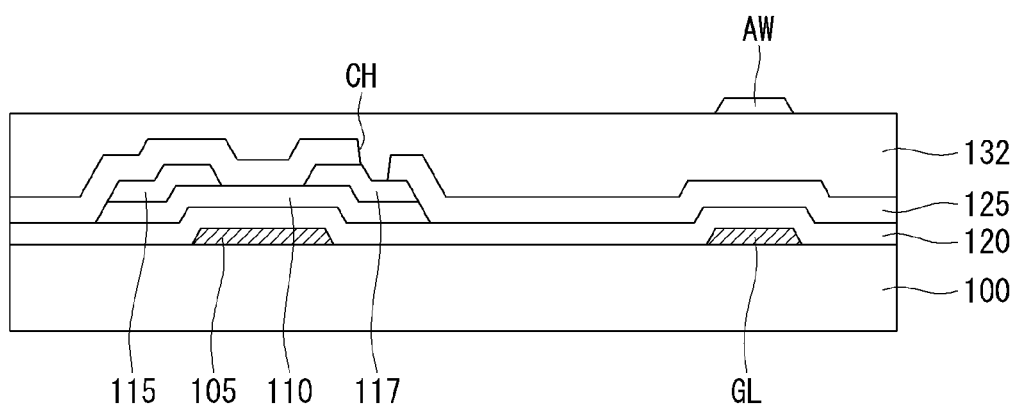

Referring to FIG. 12D, an auxiliary wire AW is formed on the lower organic insulation layer 132 with a third low-resistance metal. As mentioned above, the auxiliary wire AW on the lower organic insulation layer 132 can be formed to extend along the gate line GL or the data line DL. To increase the aperture ratio of the pixels, the auxiliary wire AW can be arranged to at least partially overlap the gate line GL or the data line DL. In this example, the auxiliary wire AW arranged on the gate line GL. Similar to the first and the second low-resistance metal layer, the third low-resistance metal layer for forming the auxiliary wire AW can be formed in a single layer structure or in a multi-layer structure using molybdenum (Mo), aluminum (Al), chrome (Cr), gold (Au), titanium (Ti), nickel (Ni), copper (Cu), and an alloy thereof.

Figure 12E:
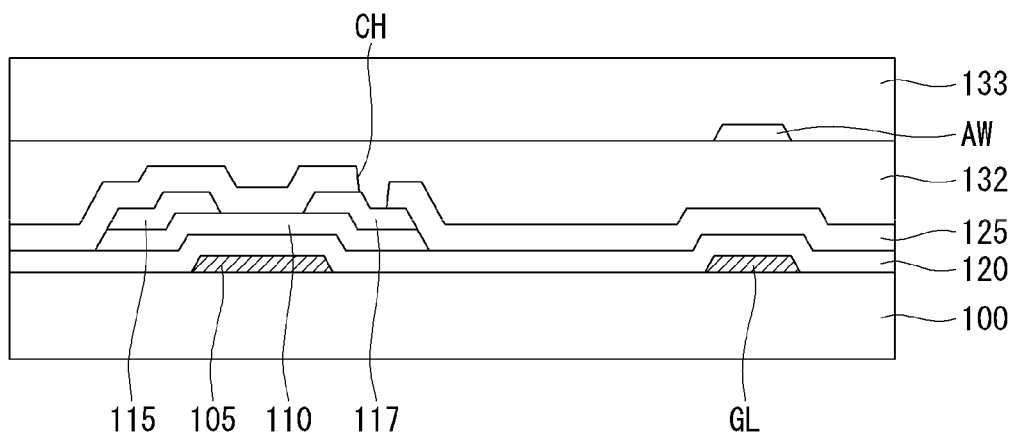
Figure 12F:
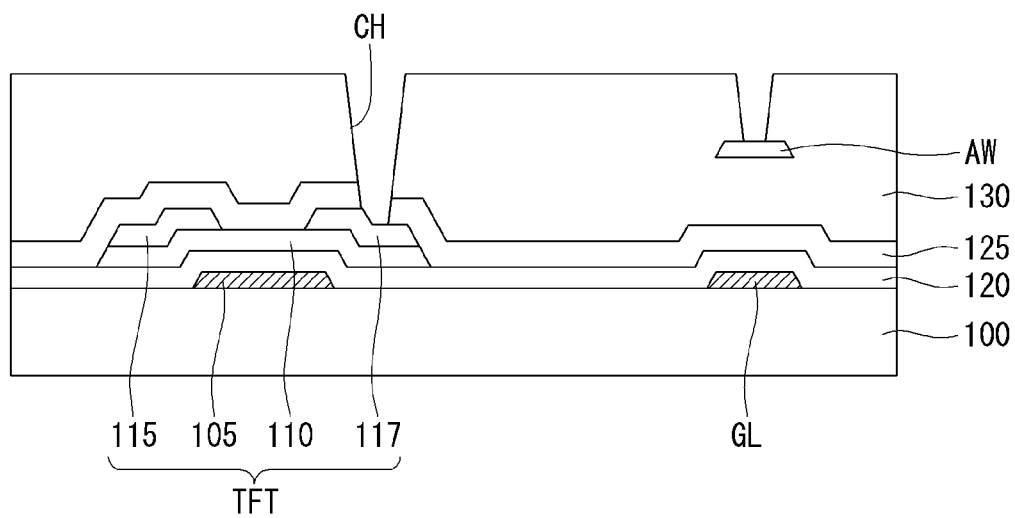

Referring to FIG. 12E, an upper organic insulation layer 133 is formed on the lower organic insulation layer 132. The upper organic insulation layer 133 covers the auxiliary wire AW on the lower organic lower insulation layer 132. The lower organic insulation layer 132 and the upper organic insulation layer 133 can be formed of the same material. Accordingly, the auxiliary wire AW is placed within the organic insulation layer 130 having lower organic insulation layer 132 and upper organic insulation layer 133 as depicted in FIG. 12F. Subsequently, contact holes are provided in the organic insulation layer 130 to expose the drain electrode 117 and the auxiliary wire AW under the organic insulation layer 130. As mentioned above, formation of the contact hole CH through the first passivation layer 125 may be formed during the formation of the contact hole through the organic insulation layer 130.

Figure 12G:
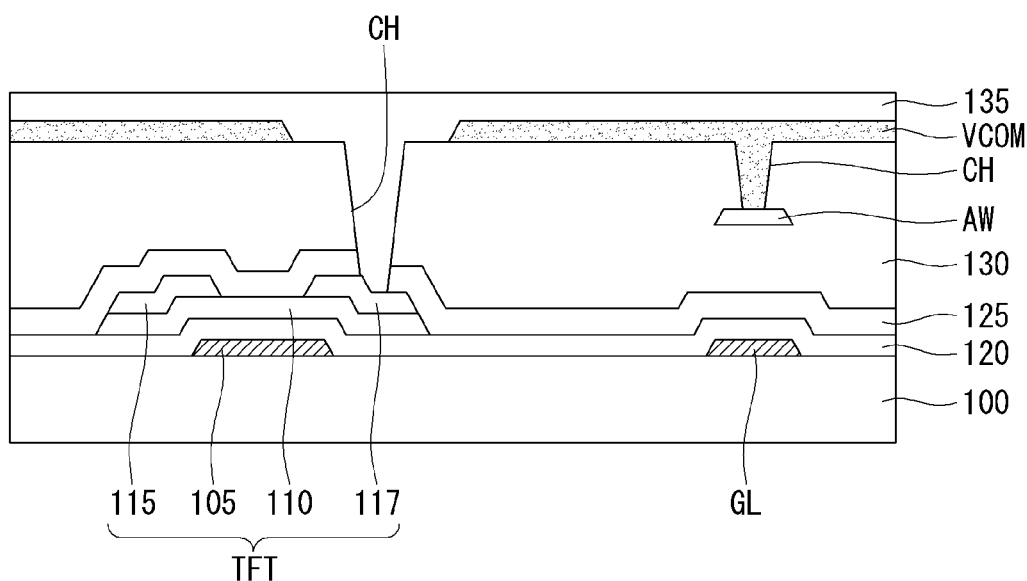

Referring to FIG. 12G, a common electrode VCOM is formed by depositing a transparent conductive material on the organic insulation layer 130. The transparent conductive material can be patterned to form the common electrode blocks, which can be configured into a touch sensor described above. The common electrode VCOM is brought into contact with the auxiliary wire AW through a contact hole CH, which exposes the auxiliary wire AW in the organic insulation layer 130. The common electrode VCOM is made of a transparent conductive material, such as ITO, IZO, ITZO, ZnO, or IGZO, which the light from the light source can pass through. A second passivation layer 135 is formed over the common electrode VCOM formed on it. The second passivation layer 135 may be made of silicon nitride (SiNx), silicon oxide (SiOx) or a combination thereof. The second passivation layer 135 may be formed such that it does not close the contact holes in the organic insulation layer 130, which exposes the drain electrode 117. Alternatively, the second passivation layer 135 can be formed over the contact hole on the drain electrode 117, then a contact hole CH is formed again through the second passivation layer 135 to expose the drain electrode 117 prior to forming the pixel electrode PXL.

Figure 12H:
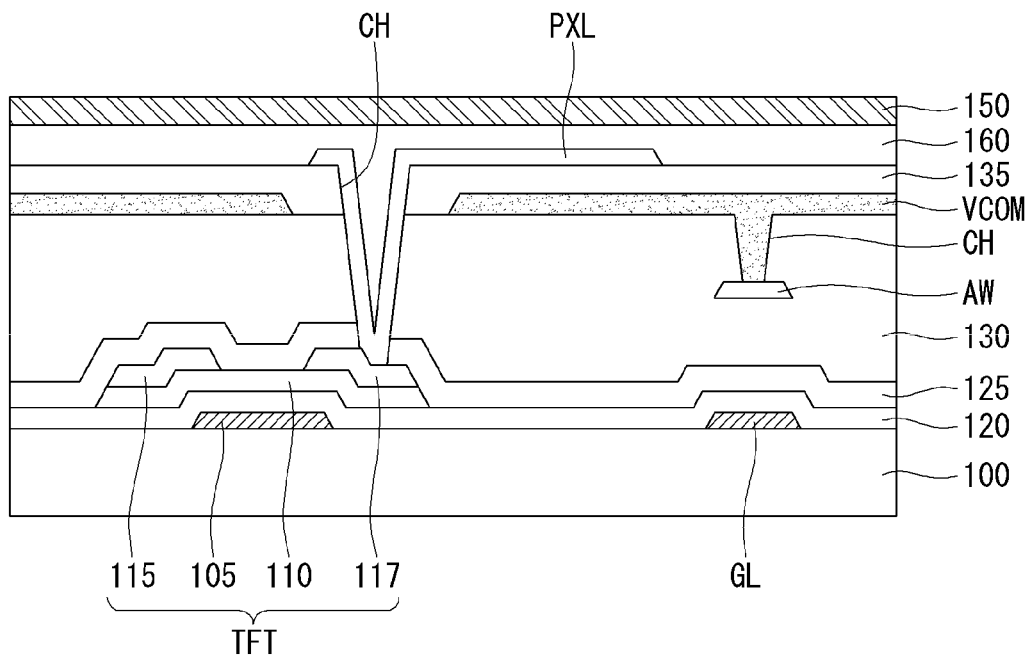

Referring to FIG. 12H, another layer of transparent conductive material is formed on the second passivation layer 135 to form the pixel electrode PXL. A part of the pixel electrode PXL is in contact with the drain electrode 117 through the contact hole CH, which penetrates through the second passivation layer 135, the organic insulation layer 130 and the first passivation layer 125. Similar to the common electrode VCOM, the pixel electrode PXL is also made of a transparent conductive material, such as ITO, IZO, ITZO, ZnO, or IGZO, which the light can pass through. Subsequently, a third passivation layer 160 is formed over the pixel electrode PXL. Similar to the above-described first and second passivation layers, the third passivation layer 160 may be made of silicon nitride (SiNx), silicon oxide (SiOx) and a combination thereof. The third passivation layer 160 can be formed in a thickness of about 500 Å to about 4,000 Å. Preferably, the third passivation layer 160 can be formed in a thickness of about 2,000 Å to about 3,500 Å, and most preferably, in a thickness of about 3,000 Å.

When the third passivation layer 160 includes a silicon nitride layer, the silicon nitride layer may be formed in a vacuum chamber with atmosphere including silane gas (SiH4) and ammonia gas (NH3). More specifically, silane gas (SiH4) and ammonia gas (NH3) are introduced into the vacuum chamber, which is maintained at 10 to 760 Torr and a temperature of 400 to 650° C. The reaction gases may include other types of atoms such as hydrogen, carbon, oxygen, or boron, in addition to the silane gas (SiH4) and ammonia gas (NH3). The silicon nitride (SiNx) thin layer is formed on the targeted surface through plasma discharge within the vacuum chamber.

The higher the content ratio of the ammonia gas in the reaction gas, the higher the resistance of the passivation layer is. As such, the content ratio of the silane gas and the ammonia gas can be adjusted to obtain a passivation layer with a desired resistivity ranging from 1E+13 Ω/cm to 1E+15 Ω/cm. It should be noted that the time it takes for forming the passivation layer increases as the content ratio of the ammonia gas increases in the reaction gas. As such, it is preferred that the ratio of silane gas and ammonia gas in reaction gas ranges between 1:10 to 1:5. Accordingly, the third passivation layer 160 may have a resistivity of 1E+14 Ω/cm or greater can be provided over the pixel electrode PXL.

Subsequently, a mixed solution of a polyimide containing a photodegradable material, e.g., cyclobutane, having a molecular weight (Mw) of 100,000 Da or greater and a polyimide precursor without the photodegradable material is applied over the third passivation layer 160. The applied solution is settled and heated (e.g., at about 200° C.) to form a lower optical alignment layer 150. In the lower optical alignment layer 150, the polyimide containing the photodegradable material is mostly present on the upper side whereas the polyimide without the photodegradable material is mostly present on the lower side. Next, the lower optical alignment layer 150 is irradiated with UV light so that the lower optical alignment layer 150 is provided with anisotropy. The upper side of the lower optical alignment layer 150, where the photodegradable material is degraded by UV light, exhibits higher resistivity than the lower side of the lower optical alignment layer 150 formed from the pre-imidized polyimide that does not contain the photodegradable material. Nevertheless, the third passivation layer 160 placed under the lower optical alignment layer 150 compensates for the relatively low resistivity at the lower part of the lower optical alignment layer 150.

Figure 12I:
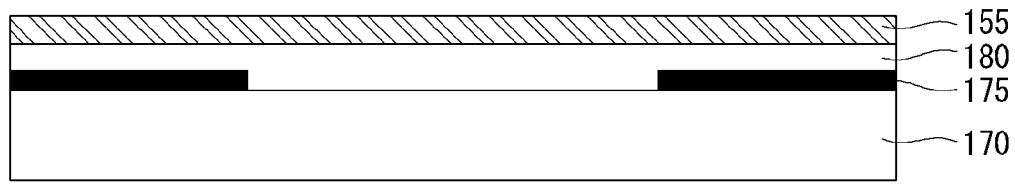

Referring to FIG. 12I, a black matrix 175 and color filters 180 are patterned on the upper substrate 170. Then, an upper optical alignment layer 155 is formed on the upper substrate 170. The upper optical alignment layer 155 can be formed in the same manner as the above-described lower optical alignment layer 150. For the upper optical alignment layer 155, the pre-imidized polyimide can also include the photo-decomposable material.

Figure 12J:
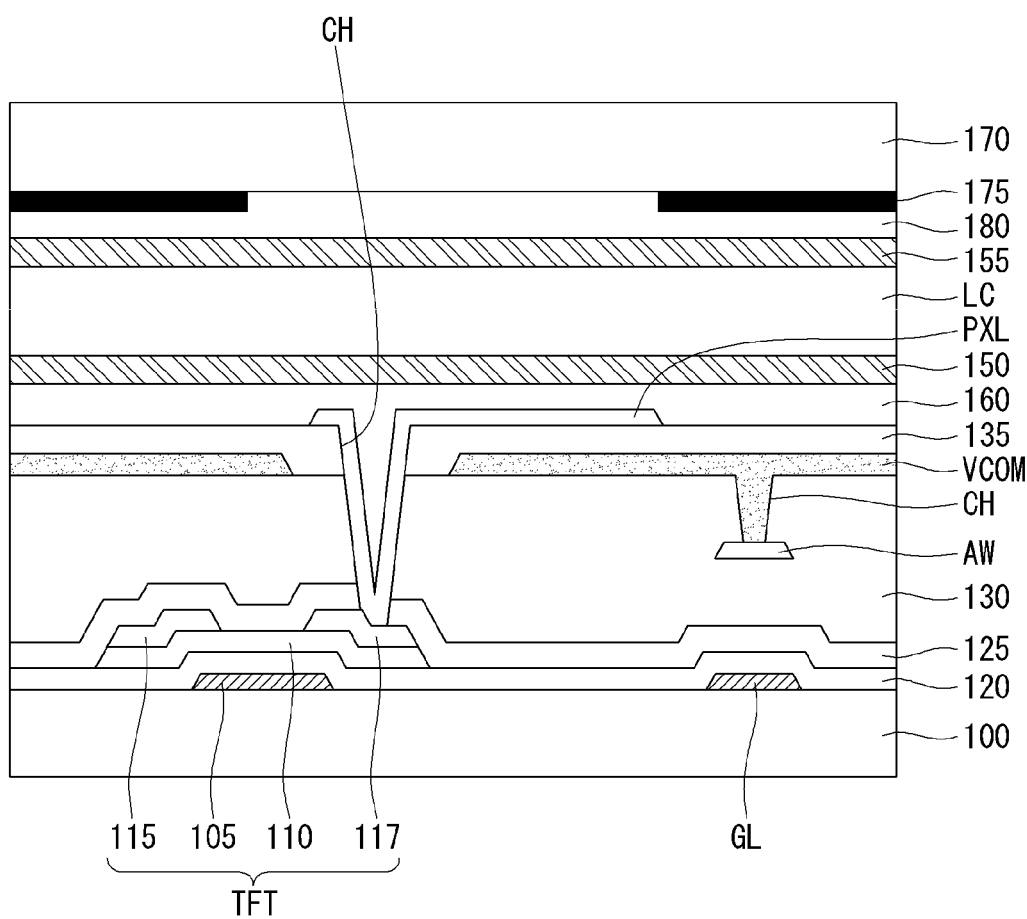

Referring to FIG. 12J, the liquid crystal layer LC is sealed between the lower substrate 100 and the upper substrate 170. As mentioned the liquid crystal layer LC can be formed with negative liquid crystals. It should be appreciated that manufacturing method described above can be modified for other configurations of the display device described in the present disclosure.

Following Table 1 shows measurements of flicker depending on the presence or absence of a third passivation layer 160 (denoted PAS3 in Table 1) between the pixel electrodes and the optical alignment layer.

TABLE 1

|  | Device 1 | Device 2 | Device 3 | Device 4 |
|---|---|---|---|---|
| Alignment layer's resistivity (Ωcm) | 1.0E+14 | 1.7E+14 | 4.4E+14 | 1.0E+14 |
| With or Without PAS3 | X  X | X  X | X  X  X  X | ○  ○  ○ |

TABLE 1-continued

| | Device 1 | | | Device 2 | | Device 3 | | | Device 4 | | |
|---|---|---|---|---|---|---|---|---|---|---|---|
| # sample | #1 | #2 | #3 | #1 | #2 | #1 | #2 | #3 | #1 | #2 | #3 |
| 60 Hz driving (dB) | −18.2 | −20.9 | −22.7 | −21.2 | −22.5 | −26.2 | −28.0 | −26.7 | −27.5 | −26.7 | −27.6 |
| average | | −20.6 | | | −21.9 | | −27.0 | | | −27.3 | |
| 30 Hz driving (dB) | −12.8 | −15.0 | −13.5 | −14.4 | −15.2 | −14.6 | −17.5 | −15.2 | −18.8 | −18.0 | −19.0 |
| average | | −13.8 | | | −14.8 | | −15.8 | | | −18.6 | |

Referring to Table 1, the first display device was provided with a lower alignment layer having resistivity of 1.0E+14 Ω/cm without the third passivation layer. The second display device was provided with a lower alignment layer having resistivity of 1.7E+14 Ω/cm without the third passivation layer. The third display device was provided with a lower alignment layer having resistivity of 4.4E+14 Ωcm without the third passivation layer. The fourth display device was provided with a lower alignment layer having resistivity of 1.0E+14 Ωcm with a third passivation layer.

The flicker pattern of the first display device was −20.6 dB on average during 60 Hz driving and −13.8 dB on average during 30 Hz driving. The flicker pattern of the second display device was −21.9 dB on average during 60 Hz driving and −14.8 dB on average during 30 Hz driving. The flicker pattern of the third display device was −27.0 dB on average during 60 Hz driving and −15.8 dB on average during 30 Hz driving. The flicker pattern of the fourth display device was −27.3 dB on average during 60 Hz driving and −18.6 dB on average during 30 Hz driving. Accordingly, the fourth display device provided with the third passivation layer had noticeable improvement in terms of the flicker pattern during 60 Hz driving and 30 Hz driving.

As described above, the display device of the present invention is optimized to lower its frame rate under certain predetermined conditions to reduce the power consumption. To reduce pixel discharge during the low frame rate mode, the display device employees the TFTs with metal oxide semiconductor layer, the optical alignment layer provided with an upper portion and a lower portion having different resistivity, the negative liquid crystal as well as the passivation layer interposed between the optical alignment layer and the pixel or the common electrode to suppress pixel discharge. As such, visual defects can be reduced even when the display device is operating under the low frame rate mode.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a display device, the method comprising:
    forming a thin film transistor on a substrate, the thin film transistor comprising a semiconductor layer made of a metal oxide;
    forming a first passivation layer on the thin film transistor;
    forming an organic insulation layer on the first passivation layer in which an auxiliary wire is placed within the organic insulation layer;
    forming a contact hole in the organic insulation layer to expose the auxiliary wire;
    forming a common electrode in the contact hole and on the organic insulation layer, the common electrode connected with the auxiliary wire to transmit a touch sensing signal;
    forming a second passivation layer on the common electrode;
    forming a pixel electrode on the second passivation layer;
    forming a third passivation layer on the pixel electrode, the third passivation layer thinner than the first passivation layer and the second passivation layer; and
    forming a lower photo alignment layer on the third passivation layer,
    wherein the third passivation layer includes a higher resistivity than the lower photo alignment layer, and
    wherein the third passivation layer has a multi-layered structure.

2. The method of claim 1, wherein the forming of the organic insulation layer and the auxiliary wire comprises:
    forming a lower organic insulation layer on the first passivation layer;
    forming the auxiliary wire on the lower organic insulation layer; and
    forming an upper organic insulation layer to cover the auxiliary wire on the lower organic insulation layer.

3. The method of claim 1, wherein the third passivation layer is formed in an atmosphere in which the ratio of silane gas and ammonia gas in the atmosphere ranges between 1:10 and 1:5.

4. The method of claim 1, further comprising:
    forming an upper substrate facing the substrate and comprising a black matrix, color filters, and an upper photo alignment layer; and
    sealing a liquid crystal layer between the substrate and the upper substrate.

5. The method of claim 4, wherein polymer chains in the upper and lower alignment layers contain a material that facilitates alignment of the polymer chains upon ultra violet (UV) light irradiation.

6. The method of claim 4, wherein the liquid crystal layer includes negative liquid crystals.

7. The method of claim 1, wherein the resistivity of the third passivation layer is $1\times10^{14}$ Ωcm or greater.

8. The method of claim 1, wherein the third passivation layer comprises at least one of silicon oxide film (SiOx) and silicon nitride film (SiNx), and has a thickness of 500 to 4,000 Å.

9. The method of claim 1, wherein the lower photo alignment layer comprising an upper part and a lower part, the upper part comprising a polymer material with a photodegradable material and of a first average molecular weight, the lower part comprising a polymer material without the photodegradable material and of a second average molecular weight lighter than the first average molecular weight.

10. The method of claim 9, wherein the polymer material comprises polyimide having a molecular weight of 100,000 DA or more.

11. The method of claim 1, wherein the thin film transistor is connected to a data line and a gate line, and the auxiliary wire extends along and at least partially overlaps the data line.

12. The method of claim 1, wherein a driver is configured to selectively adjust a timing of a signal supplied to the thin film transistor according to a driving mode.

13. The method of claim 12, wherein the driving mode includes a first frequency mode and a second frequency mode different from the first frequency mode, and wherein an image data on the display device is a moving image in the first frequency mode and an image data on the display device is a still image in the second frequency mode.

14. The method of claim 1, wherein the metal oxide comprises at least one of indium zinc oxide (InZnO) or zinc tin oxide (ZnSnO).

\* \* \* \* \*